United States Patent
Kera

(10) Patent No.: US 12,516,684 B2
(45) Date of Patent: Jan. 6, 2026

(54) THREE-POSITION CONTROL DEVICE AND THREE-POSITION CONTROL METHOD

(71) Applicant: TOKYO SEIMITSU CO., LTD., Hachioji (JP)

(72) Inventor: Toya Kera, Hachioji (JP)

(73) Assignee: TOKYO SEIMITSU CO., LTD., Hachioji (JP)

( * ) Notice: Subject to any disclaimer, the term of this patent is extended or adjusted under 35 U.S.C. 154(b) by 0 days.

(21) Appl. No.: 19/087,125

(22) Filed: Mar. 21, 2025

(65) Prior Publication Data
US 2025/0305521 A1    Oct. 2, 2025

(30) Foreign Application Priority Data

Mar. 28, 2024 (JP) ................. 2024-054102

(51) Int. Cl.
*F15B 11/12* (2006.01)
*G01N 21/84* (2006.01)
(Continued)

(52) U.S. Cl.
CPC ............ *F15B 11/121* (2013.01); *G01N 21/84* (2013.01); *G01R 31/2887* (2013.01); *H01L 21/67* (2013.01); *F15B 2211/20576* (2013.01); *F15B 2211/30565* (2013.01); *F15B 2211/327* (2013.01); *F15B 2211/6336* (2013.01);
(Continued)

(58) Field of Classification Search
CPC ............... F15B 11/121; F15B 13/0401; F15B 2211/20576; F15B 2211/30565; F15B 2211/327; F15B 2211/6336; F15B 2211/7053; F15B 2211/7653; F15B 2211/8855; G01N 21/84; G01R 31/2887; H01L 21/67
See application file for complete search history.

(56) References Cited

U.S. PATENT DOCUMENTS 3,991,661 A * 11/1976 Mocha .................. F15B 11/123
  92/13
5,165,322 A * 11/1992 Moody ................. F15B 11/123
  92/65
(Continued)

FOREIGN PATENT DOCUMENTS

JP    11-002203 A    1/1999

*Primary Examiner* — Dustin T Nguyen
(74) *Attorney, Agent, or Firm* — PROCOPIO, CORY, HARGREAVES & SAVITCH LLP

(57) ABSTRACT

A three-position control device includes a cylinder device, a fluid control unit, and a displacement restriction device. The cylinder device displaces a piston to each of a retracted position, an intermediate position, and an advanced position. The cylinder device has a first fluid chamber for retraction and a second fluid chamber for advance. A fluid control unit switches an advanced/retracted position of the piston. A second working pressure during displacement from an intermediate position to the advanced position is set to be greater than a first working pressure during displacement from the retracted position to the intermediate position. The displacement restriction device has a load receiving portion and a biasing means. A biasing force of the biasing means is set to be greater than a thrust caused by the first working pressure and smaller than a thrust caused by the second working pressure.

3 Claims, 12 Drawing Sheets

(51) Int. Cl.
*G01R 31/28* (2006.01)
*H01L 21/67* (2006.01)

(52) U.S. Cl.
CPC ............... *F15B 2211/7053* (2013.01); *F15B 2211/7653* (2013.01); *F15B 2211/8855* (2013.01)

(56) References Cited

U.S. PATENT DOCUMENTS

| | | | | |
|---|---|---|---|---|
| 5,189,942 | A * | 3/1993 | Ohkubo | F15B 11/122 92/135 |
| 6,658,842 | B2 * | 12/2003 | Yamasaki | F15B 21/04 91/437 |
| 6,807,895 | B2 * | 10/2004 | Hirano | F15B 11/123 92/62 |
| 9,725,246 | B2 * | 8/2017 | Pawelski | F15B 15/1404 |
| 2011/0005385 | A1 * | 1/2011 | Truong | F15B 15/1409 91/417 R |
| 2012/0144945 | A1 * | 6/2012 | Bai | F16H 61/30 74/473.11 |

* cited by examiner

THREE-POSITION CONTROL DEVICE AND THREE-POSITION CONTROL METHOD

BACKGROUND OF THE INVENTION

Field of the Invention

The present invention relates to a three-position control device and a three-position control method for stopping a control object at three positions, that is, a retracted position, an intermediate position, and an advanced position.

Priority is claimed on Japanese Patent Application No. 2024-054102, filed Mar. 28, 2024, the content of which is incorporated herein by reference.

Description of Related Art

A three-position control device that uses an air cylinder to stop a control object at three positions is known (see, for example, Patent Document 1).

In the three-position control device disclosed in Patent Document 1, a piston is slidably housed within a cylinder body of an air cylinder, and the inside of the cylinder body is separated into two air chambers by the piston. A piston rod that passes through an end wall of the cylinder body is connected to the piston, and a control object can be connected to the piston rod. In addition, the cylinder body is provided with a magnetic sensor for detecting the advanced/retracted position of the piston.

In this three-position control device, in a case where the control object is displaced to the retracted position, high-pressure air is introduced into one air chamber, and air in the other air chamber is discharged to the outside. Conversely, in a case where the control object is displaced to the advanced position, high-pressure air is introduced into the other air chamber, and air in the one air chamber is discharged to the outside.

In addition, in a case where the control object is stopped at the intermediate position, high-pressure air is introduced into the two air chambers at the front and rear of the piston at a timing when the magnetic sensor detects that the piston has been displaced to the intermediate position. This causes the piston to be pressed by the high-pressure air from both the front and rear sides, and the piston stops at the intermediate position together with the control object.

Patent Document

[Patent Document 1] Japanese Unexamined Patent Application, First Publication No. H11-2203

SUMMARY OF THE INVENTION

However, the three-position control device disclosed in Patent Document 1 fixes the position of the piston by introducing high-pressure air into air chambers located at the front and rear of the piston at a timing when the magnetic sensor detects that the piston has been displaced to the intermediate position. For this reason, a time lag is likely to occur between when the piston is displaced to the intermediate position and when the piston is actually braked by the high-pressure air, which makes it difficult to stop the piston at the intermediate position with high accuracy. An attempt to stop the piston at the intermediate position with high accuracy makes it difficult for the piston to be displaced rapidly.

In addition, the three-position control device disclosed in Patent Document 1 holds the piston at the intermediate position by balancing the air pressure acting on the front and rear of the piston. This makes it difficult to stably stop the piston and the control object at the intermediate position, and thus an improvement in this respect is desired.

Consequently, the present invention aims to provide a three-position control device and a three-position control method that make it possible to quickly and accurately displace a control object to an intermediate position, and to stably maintain the displaced control object in a stopped state at the intermediate position.

In order to solve the above problem, the following configurations are adopted in a three-position control device and a three-position control method according to the present invention.

That is, according to an aspect of the present invention, there is provided a three-position control device including: a cylinder device having a piston which is interlocked with a control object, the piston being displaceable to each of a retracted position, an intermediate position, and an advanced position by receiving a thrust of a working fluid; a fluid control unit that controls intake and discharge of a working fluid to and from the cylinder device; and a displacement restriction device that restricts displacement of the piston moving from the retracted position toward the advanced position at the intermediate position, wherein the cylinder device has a first fluid chamber into which the working fluid is introduced so that the piston is pressed toward the retracted position, and a second fluid chamber into which the working fluid is introduced so that the piston is pressed toward the advanced position, the fluid control unit is switchable between a first flow path for introducing the working fluid into the first fluid chamber at a predetermined working pressure and discharging the working fluid from the second fluid chamber, a second flow path for introducing the working fluid into the second fluid chamber at a first working pressure and discharging the working fluid from the first fluid chamber, and a third flow path for introducing the working fluid into the second fluid chamber at a second working pressure higher than the first working pressure and discharging the working fluid from the first fluid chamber, the displacement restriction device has a load receiving portion that receives a load of the piston moving toward the advanced position when the piston is displaced from the retracted position to the intermediate position, and a biasing means for biasing the load receiving portion in a direction against a load input from the piston, and a biasing force of the biasing means is set to be greater than a thrust of the piston caused by the first working pressure and smaller than the thrust of the piston caused by the second working pressure.

In a case where the control object is displaced to the retracted position by the three-position control device of this aspect, the fluid control unit is switched to the first flow path. This causes the working fluid of a predetermined working pressure to be introduced into the first fluid chamber, and the working fluid in the second fluid chamber is discharged to the outside. As a result, the piston is displaced to the retracted position together with the control object.

In addition, in a case where the control object is displaced from the retracted position to the intermediate position, the fluid control unit is switched to the second flow path. This causes the working fluid of the first working pressure to be introduced into the second fluid chamber, and the working fluid in the first fluid chamber is discharged to the outside. As a result, the piston is displaced to the intermediate position together with the control object. In this case, when the piston is displaced to the intermediate position, the piston comes into contact with the load receiving portion of the displacement restriction device directly or indirectly to thereby receive the load in the displacement direction.

In this case, the load receiving portion is biased by the biasing means in a direction against the load input from the piston, and the biasing force of the biasing means is set to be greater than the thrust of the piston caused by the first working pressure and smaller than the thrust of the piston caused by the second working pressure. Therefore, the piston which is advanced by the thrust caused by the first working pressure has its load received by the load receiving portion of the displacement restriction device, and further forward displacement is restricted. As a result, the piston and the control object are stably maintained in a stopped state at the intermediate position.

In a case where the control object is displaced from the intermediate position to the advanced position, the fluid control unit is switched to the third flow path. This causes the working fluid of the second working pressure to be introduced into the second fluid chamber, and the working fluid in the first fluid chamber is discharged to the outside. As a result, the piston receives a thrust greater than the biasing force of the biasing means of the displacement restriction device and is displaced to the advanced position together with the control object.

In the three-position control device of this configuration, the piston can be displaced by appropriate working pressure (first working pressure and second working pressure) depending on the presence or absence of the biasing force of the biasing means of the displacement restriction device, or the like, and thus the control object can be quickly displaced to a desired stop position.

The biasing means may be a spring member, and an initial load at which the spring member starts to deform may be set to be greater than the thrust of the piston caused by the first working pressure and smaller than the thrust of the piston caused by the second working pressure.

In this case, the biasing force at the start of biasing can be easily set and adjusted by adjusting the initial load of the spring member, and the configuration of the biasing means can be simplified.

It is preferable that the predetermined working pressure be set to be equal to the first working pressure or the second working pressure.

In this case, the pressure sources that can be switched and used by the fluid control unit can be restricted to only two types with different pressures. Therefore, in a case where this configuration is adopted, it is possible to simplify a fluid system to be used, and to make the fluid control unit compact.

The fluid control unit may include a flow path switching valve capable of selectively connecting and switching a supply flow path and a discharge flow path of the working fluid to the first fluid chamber and the second fluid chamber, and a pressure switching valve capable of selectively switching a pressure source connected to the supply flow path between a first pressure source whose pressure is the first working pressure and a second pressure source whose pressure is the second working pressure.

In this case, a combination of the flow path switching valve and the pressure switching valve makes it possible to easily obtain the fluid control unit capable of switching between the first, second, and third flow paths.

The cylinder device may include a cylinder body in which the piston is retractably housed, and a piston rod which is connected to the piston and protrudes outward from an axial end of the cylinder body, the displacement restriction device may be installed outside the cylinder body so that a displacement direction of the load receiving portion is parallel to the axial direction of the piston rod, and a load transfer arm capable of transferring a load acting on the piston rod from the piston to the load receiving portion may be connected to the piston rod.

In this case, when the piston receives a thrust from the working fluid and is displaced back and forth, the displacement is transferred to the load transfer arm outside the cylinder body through the piston rod. Therefore, even in a case where the displacement restriction device is disposed at a separated position outside the cylinder body, it is possible to transfer the behavior of the piston to the load receiving portion of the displacement restriction device through the load transfer arm. Therefore, in a case where this configuration is adopted, it becomes possible to flexibly change the space occupation form of the three-position control device in accordance with the installation position and the like.

In addition, according to an aspect of the present invention, there is provided a three-position control method using a cylinder device having a piston which is interlocked with a control object, the piston being displaceable to each of a retracted position, an intermediate position, and an advanced position by receiving a thrust of a working fluid, and a displacement restriction device that restricts displacement of the piston moving from the retracted position toward the advanced position at the intermediate position, wherein the cylinder device is provided with a first fluid chamber into which the working fluid is introduced so that the piston is pressed toward the retracted position and a second fluid chamber into which the working fluid is introduced so that the piston is pressed toward the advanced position, the displacement restriction device is provided with a load receiving portion that receives a load of the piston moving toward the advanced position when the piston is displaced from the retracted position to the intermediate position, and a biasing means for biasing the load receiving portion in a direction against a load input from the piston, a biasing force of the biasing means is set to be greater than a thrust caused by a working pressure of the working fluid when the piston is displaced from the retracted position to the intermediate position, and to be smaller than a thrust caused by the working pressure of the working fluid when the piston is displaced from the intermediate position to the advanced position, and the method includes: when the piston is displaced to the retracted position, introducing the working fluid into the first fluid chamber at a predetermined working pressure and discharging the working fluid from the second fluid chamber; when the piston is displaced from the retracted position to the intermediate position and stopped at the intermediate position, introducing the working fluid into the second fluid chamber at a first working pressure and discharging the working fluid from the first fluid chamber; and when the piston is displaced from the intermediate position to the advanced position, introducing the working fluid into the second fluid chamber at a second working pressure higher than the first working pressure and discharging the working fluid from the first fluid chamber.

In the three-position control method of this aspect, the load receiving portion is biased by the biasing means in a direction against the load input from the piston. The biasing force of the biasing means is set to be greater than the thrust of the piston caused by the first working pressure when the piston is displaced from the retracted position to the intermediate position, and to be smaller than the thrust of the piston caused by the second working pressure when the piston is moved from the intermediate position to the advanced position. Therefore, when the piston is advanced by the thrust caused by the first working pressure during displacement from the retracted position to the intermediate position, the piston has its load received by the load receiving portion of the displacement restriction device, and further forward displacement is restricted. As a result, the piston and the control object are stably maintained in a stopped state at the intermediate position.

In addition, in the three-position control method of this aspect, the pressure of the working fluid introduced into the second fluid chamber is changed when the piston is displaced from the retracted position to the intermediate position and when the piston is displaced from the intermediate position to the advanced position. Therefore, the piston can be quickly displaced from the intermediate position to the advanced position without being significantly affected by the difference in the pressure receiving surfaces located at the front and rear of the piston, and the like.

According to the three-position control device and the three-position control method of the present invention, it is possible to quickly and accurately displace the control object to the intermediate position, and to stably maintain the displaced control object in a stopped state at the intermediate position.

DETAILED DESCRIPTION OF THE INVENTION

Figure 1:
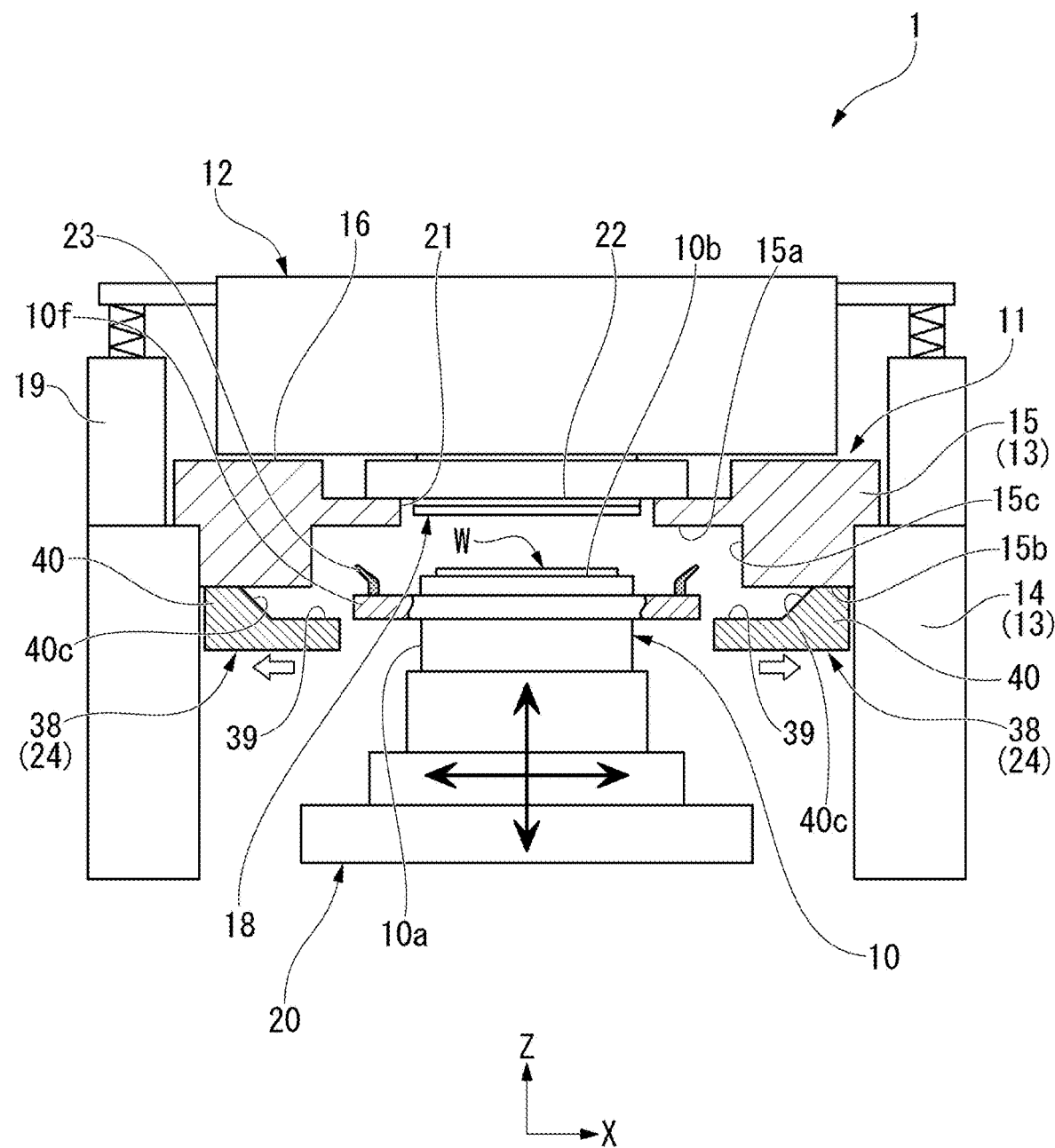
FIG. 1 is a partial cross-sectional front view illustrating a state before a wafer chuck of a wafer inspection device according to an embodiment is mounted.

Hereinafter, an embodiment of the present invention will be described with reference to the accompanying drawings.

Meanwhile, arrows X, Y, and Z indicating an orthogonal coordinate system are shown at appropriate positions in the drawings. The arrow Z in the orthogonal coordinate system points vertically upward, the arrow X points in a direction orthogonal to the Z direction, and the arrow Y points in a direction orthogonal to the Z direction and the X direction.

FIG. 1 is a partial cross-sectional front view of a wafer inspection device 1 according to an embodiment.

The wafer inspection device 1 constitutes a portion of a system for performing wafer level inspection. The wafer inspection device 1 includes a prober 11 that brings probes into contact with electrodes of each chip on a wafer W, and a test head 12 which is electrically connected the probes to supply a power supply current and a test signal to each chip and measure a signal which is output from each chip. The test head 12 is a device for performing electrical inspection on each chip, and determines whether the chip is operating normally on the basis of the measurement value of the signal output from each chip.

A housing 13 of the wafer inspection device 1 has a sidewall 14 and a ceiling wall 15. The ceiling wall 15 constitutes a head stage on which a plurality of measurement units 16 are disposed. The prober 11 is disposed on each of the measurement units 16. Although only one measurement unit 16 is illustrated on the ceiling wall 15 in FIG. 1, a plurality of measurement units 16 are provided in parallel on the ceiling wall 15 of the housing 13.

The prober 11 includes a probe card 18 having a large number of probes (not shown) corresponding to the electrodes of each chip on the wafer W, a wafer chuck 10 that holds the wafer W on its upper surface, and an alignment device 20 that releasably holds the wafer chuck 10 and aligns the wafer W and the probe card 18 through the wafer chuck 10. Each of the measurement units 16 can perform simultaneous inspection on all chips on the wafer W held by the wafer chuck 10. The alignment device 20 is configured to be movable between the plurality of measurement units 16 by a moving device (not shown). One alignment device 20 is shared by a plurality of probers 11.

In addition, the test head 12 corresponding to each of the measurement units 16 is attached to the upper portion of the housing 13 through a support wall 19.

A card mounting portion 21 (mounting hole) is provided for each measurement unit 16 on the ceiling wall 15 (head stage) of the housing 13. The probe card 18 is replaceably disposed in each card mounting portion 21. The probe card 18 detachably attached to the lower surface of the corresponding test head 12 through a contactor 22. Each probe of the probe card 18 is electrically connected to a base in the test head 12 through the contactor 22. The wafer W to be inspected, which is held by the wafer chuck 10, is superimposed in a pressed state on the lower surface of the probe card 18.

The wafer chuck 10 is formed in a cylindrical shape with a short axis as a whole, and has an annular flange wall 10f protrusively provided at an upward position on the outer circumferential surface of a main body 10a. The central region of the upper surface of the main body 10a is a mounting surface 10b on which the wafer W is placed. Meanwhile, when the wafer W is placed on the mounting surface 10b, the wafer W is positioned by a positioning portion (not shown) so as to be concentric with the wafer chuck 10. A first suction port connected to a suction device (not shown) is formed on the mounting surface 10b. When vacuum suction is performed through the first suction port in a state where the wafer W is placed on the mounting surface 10b, the wafer W is adsorbably fixed to the mounting surface 10b. This makes it possible for the wafer W to move and stop integrally with the wafer chuck 10.

However, a means for fixing the wafer W to the mounting surface 10b is not limited to adsorption by vacuum suction, and the wafer W may be fixed to the mounting surface 10b by a mechanical mechanism.

The wafer chuck 10 is releasably held on the upper portion of the alignment device 20 and is movable in the X-Y-Z-θ directions by the alignment device 20. Meanwhile, an engagement portion (not shown) is provided between the lower end of the main body 10a of the wafer chuck 10 and the chuck holding portion of the alignment device 20 to fix the relative positions of the two.

In addition, a sealing mechanism is provided on the upper portion of the wafer chuck 10. The sealing mechanism includes a ring-shaped seal member 23 attached near the outer circumferential edge of the upper surface of the wafer chuck 10, a second suction port (not shown) provided at a position away from the mounting surface 10b of the wafer chuck 10, and a suction device (not shown) connected to the second suction port. The second suction port is disposed at a position facing the inner circumferential side (radially inward) of the ring-shaped seal member 23.

When the wafer chuck 10 is pushed upward by a lifting portion of the alignment device 20 in a state where it is held by the alignment device 20, the ring-shaped seal member 23 comes into contact with the lower surface of the ceiling wall 15 around the probe card 18. Hereinafter, the portion of the lower surface of the ceiling wall 15 that comes into contact with the ring-shaped seal member 23 is referred to as a "chuck adsorption surface 15a."

In this state, when vacuum suction is performed through the second suction port, an internal space S (see FIG. 6) sealed by the ring-shaped seal member 23 is depressurized, and the wafer chuck 10 is pulled toward the ceiling wall 15 (the probe card 18). As a result, the upper surface of the wafer W on the wafer chuck 10 is pressed against the probe card 18, and a plurality of probes of the probe card 18 are contacted with and connected to the corresponding electrodes on the wafer W. The chuck holding portion of the alignment device 20 is then retracted downward.

Meanwhile, in the present embodiment, the ring-shaped seal member 23 is configured to come into contact with the lower surface of the ceiling wall 15, but the ring-shaped seal member 23 may be configured to come into contact with the peripheral edge of the lower surface of the probe card 18.

The chuck adsorption surface 15a on the lower surface of the ceiling wall 15 is formed to be recessed in a circular shape upward from the outer region thereof. Hereinafter, the region of the lower surface of the ceiling wall 15 which is outside the chuck adsorption surface 15a is referred to as an "outer lower surface 15b," and the upwardly recessed portion between the outer lower surface 15b and the chuck adsorption surface 15a is referred to as a "chuck housing portion 15c." A plurality of drop restriction mechanisms 24 that restrict the dropping of the wafer chuck 10 from the lower surface of the ceiling wall 15 (the measurement unit 16) is provided on the outer lower surface 15b of the ceiling wall 15.

The detailed structure of the drop restriction mechanism 24 will be described in detail later.

Figure 2:
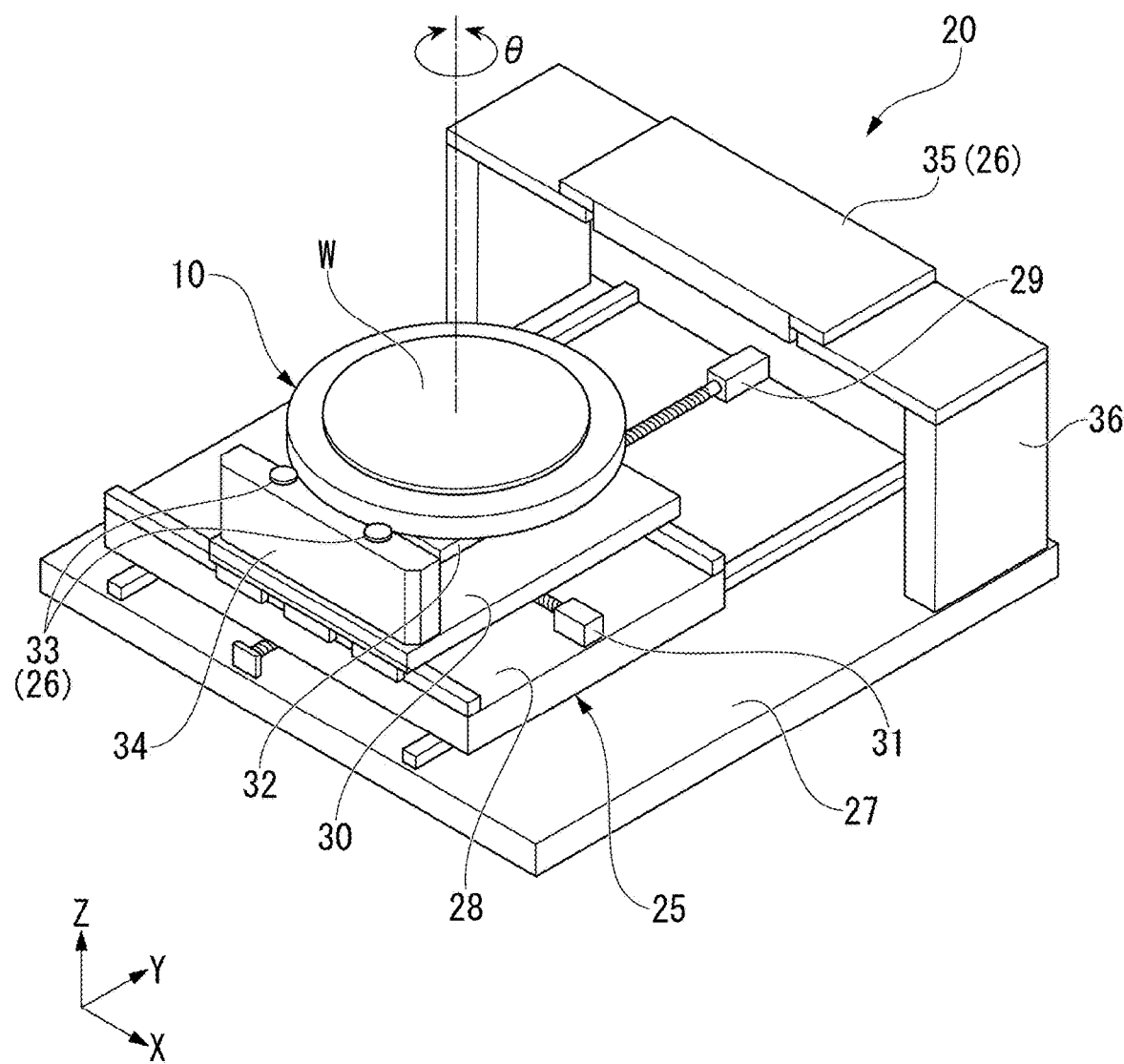
FIG. 2 is a perspective view illustrating a schematic configuration of an alignment device according to the embodiment.

FIG. 2 is a perspective view illustrating a schematic configuration of the alignment device 20. Meanwhile, FIG. 2 shows a state in which the wafer chuck 10 is held on the upper portion of the alignment device 20.

The alignment device 20 includes a movement and rotation mechanism 25 that moves the wafer chuck 10 in the X-Y-Z-θ directions, and an alignment mechanism 26 that detects the relative positional relationship between the electrodes of each chip on the wafer W held by the wafer chuck 10 and the corresponding probes on the probe card 18 side. The alignment device 20 detects the relative positional relationship between the electrodes of each chip on the wafer W held by the wafer chuck 10 and the probes on the probe card 18 side using the alignment mechanism 26, and the movement and rotation mechanism 25 moves the wafer chuck 10 on the basis of the detection result so as to bring the electrodes of each chip into contact with the probes.

The alignment device 20 includes a base table 27 connected to a moving device (not shown). The moving device moves between the plurality of measurement units 16 through the operation of an actuator (not shown). A Y-axis moving table 28 which is movable in the Y-axis direction is supported on the base table 27. The Y-axis moving table 28 can be moved to any position in the Y-axis direction by a Y-axis actuator 29 using a ball screw, a motor, and the like. An X-axis moving table 30 which is movable in X-axis direction is supported on the Y-axis moving table 28. The X-axis moving table 30 can be moved to any position in the X-axis direction by an X-axis actuator 31 using a ball screw, a motor, and the like. A Z axis moving and rotating unit 32 having a chuck holding portion (not shown) on the upper portion is installed on the X-axis moving table 30. The wafer chuck 10 is releasably held by the chuck holding portion.

The movement and rotation mechanism 25 is constituted by the Z axis moving and rotating unit 32, the X-axis moving table 30, the Y-axis moving table 28, and the like.

Probe position detection cameras 33 are installed above the X-axis moving table 30 with a camera moving mechanism 34 interposed therebetween. The probe position detection cameras 33 detect the position of the probe on the probe card 18 at the lower position of the measurement unit 16. In addition, an alignment camera 35 is installed on the base table 27 with a prop 36 interposed therebetween. The imaging unit of the alignment camera 35 is disposed so as to face downward. The alignment camera 35 detects the positions of the electrodes of each chip on the wafer W when the wafer chuck 10 holding the wafer W is moved below the imaging unit by the movement of the Y-axis moving table 28. Each output unit of the probe position detection cameras 33 and the alignment camera 35 connected to an image processing unit (not shown). The movement and rotation mechanism 25 adjusts the position of the wafer chuck 10 (the wafer W) on the basis of image information detected by the probe position detection cameras 33 and the alignment camera 35.

The alignment mechanism 26 is constituted by the probe position detection cameras 33, the alignment camera 35, the image processing unit, and the like.

Next, the drop restriction mechanism 24 will be described.

Figure 3:
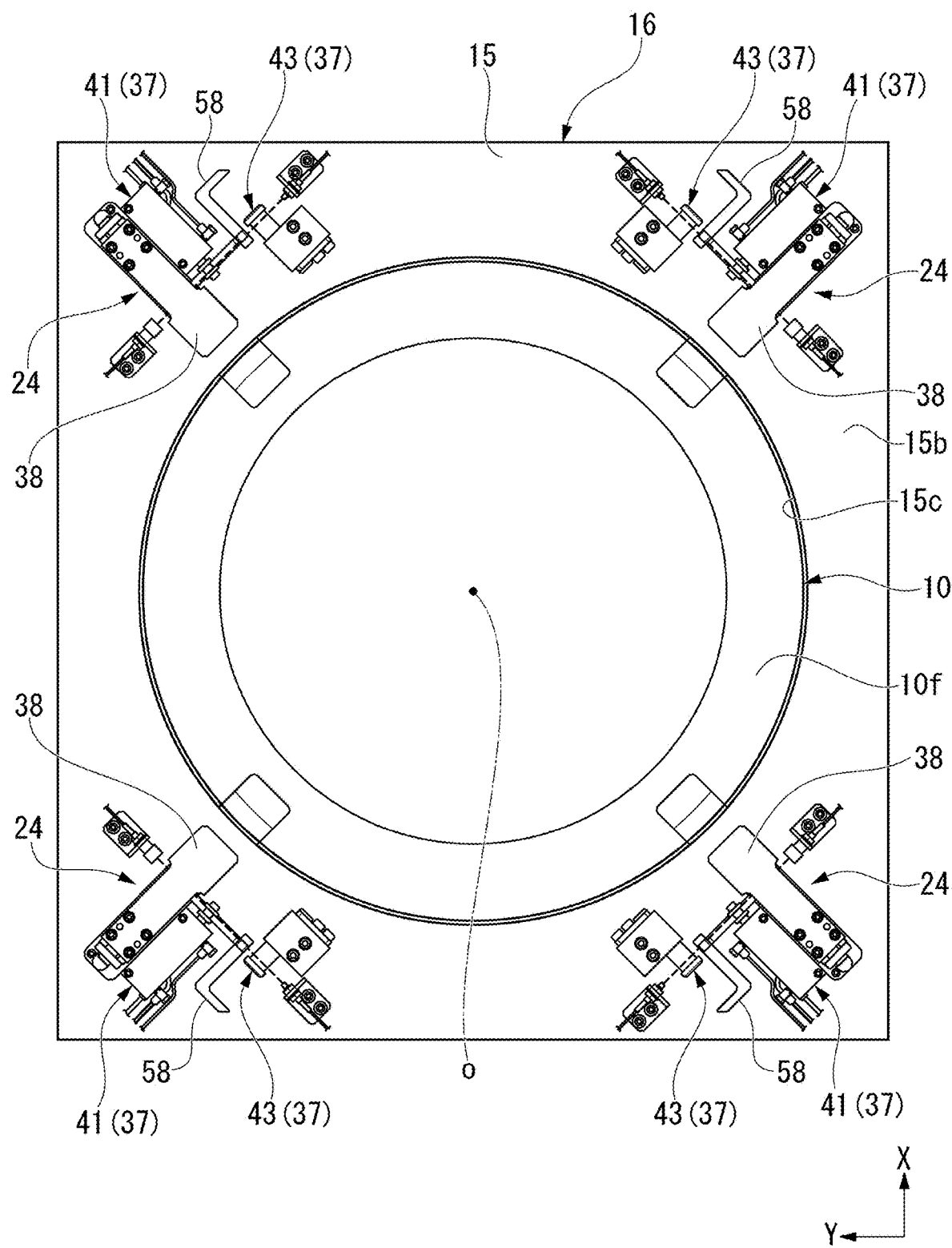
FIG. 3 is a bottom view of a measurement unit and the wafer chuck according to the embodiment.
Figure 4:
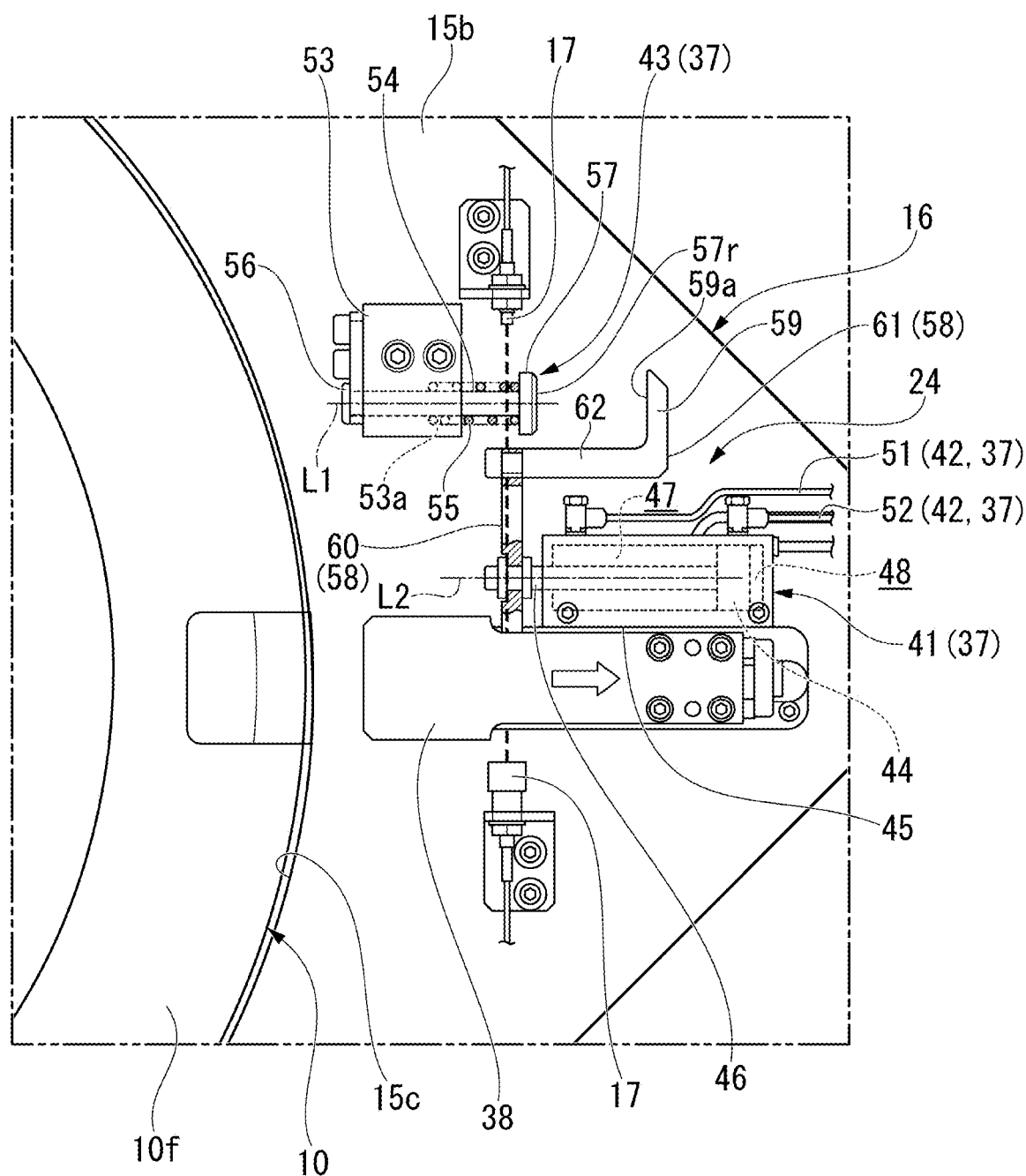
FIG. 4 is an enlarged view of a portion of FIG. 3 when a drop restriction claw is in a retracted position.
Figure 5:
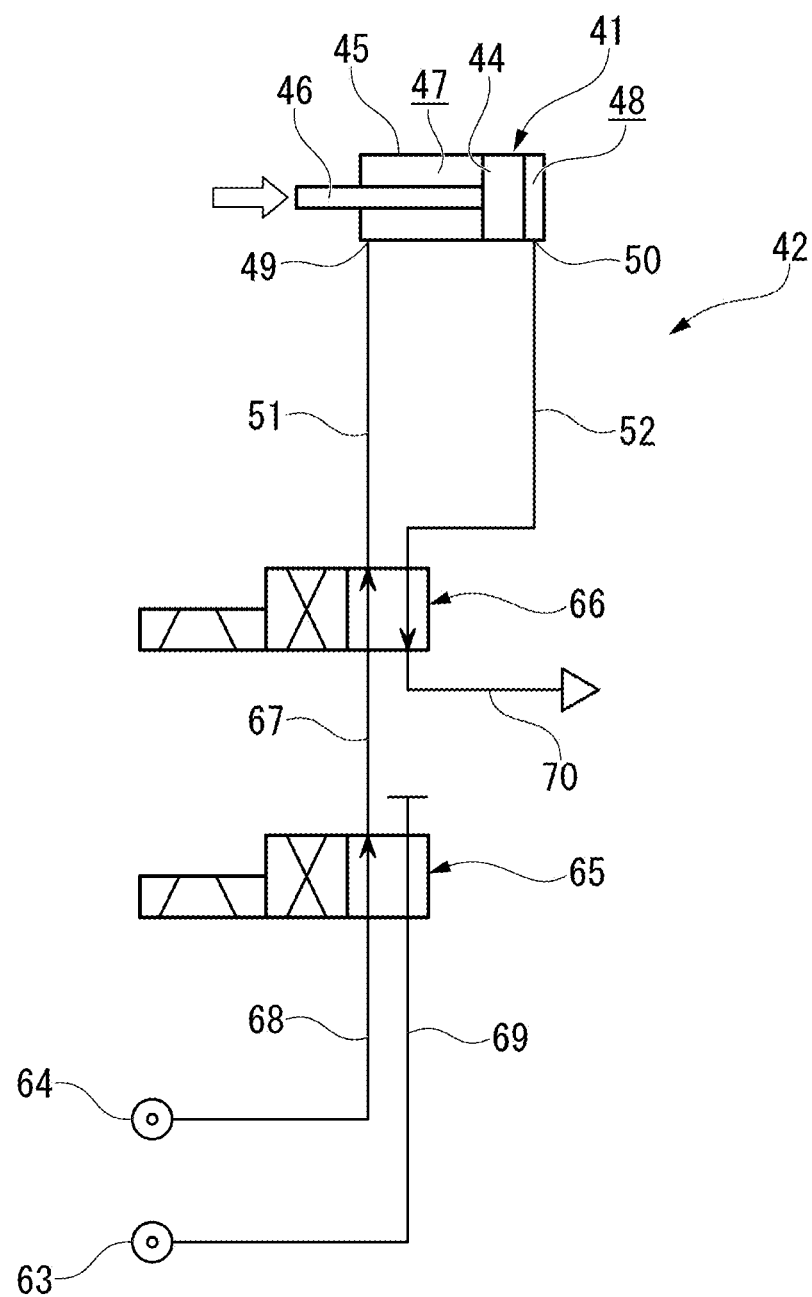
FIG. 5 is a circuit diagram of a fluid control unit illustrating a state when a three-position control device of the embodiment performs control to bring the drop restriction claw to a retracted position.

FIG. 3 is a bottom view of the measurement unit 16 and the wafer chuck 10, and FIG. 4 is an enlarged view of a portion of FIG. 3. FIG. 5 is a circuit diagram illustrating a fluid control unit 42 of a three-position control device 37 (position control device) used in each of the drop restriction mechanisms 24.

As shown in FIG. 3, in the present embodiment, four drop restriction mechanisms 24 are provided around the periphery of the chuck housing portion 15c on the lower surface of the ceiling wall 15 of the measurement unit 16. The four drop restriction mechanisms 24 are disposed apart at 90° intervals around the periphery of the chuck housing portion 15c. All four drop restriction mechanisms 24 have the same configuration. As shown in FIGS. 3 and 4, each of the drop restriction mechanisms 24 includes a drop restriction claw 38 retractably provided on the outer lower surface 15b of the ceiling wall 15, and the three-position control device 37 that controls the advanced/retracted position of the drop restriction claw 38.

Meanwhile, in the present embodiment, the four drop restriction mechanisms 24 are provided around the periphery of the chuck housing portion 15c, but the number of drop restriction mechanisms 24 installed is not limited to four. The number of drop restriction mechanisms 24 installed need only be two or more. However, from the viewpoint of efficiently centering the wafer chuck 10 as described later, the number is preferably three or more. In addition, in a case where the number of drop restriction mechanisms 24 installed is two, it is preferable that the two drop restriction mechanisms 24 are disposed at positions which are point-symmetric with respect to the axial center position o of the wafer chuck 10.

The drop restriction claw 38 is attached to the outer lower surface 15b of the ceiling wall 15 so as to advance and retract in the radial direction of the circular chuck housing portion 15c of the ceiling wall 15. The outer circumferential edge of the flange wall 10f of the wafer chuck 10 housed in the chuck housing portion 15c is formed in a circular shape in a plan view. Therefore, it can also be said that the drop restriction claw 38 advances and retracts in the radial direction of the wafer chuck 10.

Hereinafter, among the advanced/retracted positions of the drop restriction claw 38, the side closer to the axial center position o of the wafer chuck 10 is referred to as "front," and the opposite side is referred to as "rear." The drop restriction claw 38 is configured to be capable of being displaced and stopped at three positions, that is, a retracted position, an intermediate position, and an advanced position, by position control performed by the three-position control device 37.

The retracted position is a position at which the drop restriction claw 38 is retracted rearward to the maximum extent. When the drop restriction claw 38 is in the retracted position, the tip of the drop restriction claw 38 is located further radially outward than the chuck housing portion 15c. In this state, the wafer chuck 10 can be moved in and out of the chuck housing portion 15c in the vertical direction. That is, the wafer chuck 10 is allowed to pass between the plurality of drop restriction claws 38 in the vertical direction.

The intermediate position is a position between the retracted position and the advanced position. When the drop restriction claw 38 is in the intermediate position, the tip of the drop restriction claw 38 is located at a position where it protrudes radially inward of the chuck housing portion 15c by a predetermined amount. In this state, when the wafer chuck 10 adsorbably fixed to the lower surface of the measurement unit 16 moves away from the measurement unit 16 due to the power supply being turned off, or the like, the wafer chuck 10 can be received below (see FIG. 9).

In addition, the advanced position is a position at which the drop restriction claw 38 is advanced forward to the maximum extent. When the drop restriction claw 38 is in the advanced position, the tip of the drop restriction claw 38 is located at a position where it protrudes further radially inward of the chuck housing portion 15c. In this state, the drop restriction claw 38 comes into contact with the outer circumferential edge of the wafer chuck 10, and the position of the wafer chuck 10 can be corrected to a specified centering position.

When the upper portion of the wafer chuck 10 is disposed within the chuck housing portion 15c, the drop restriction claw 38 includes a support surface 39 (see FIG. 1) capable of supporting the lower surface of the outer circumferential edge of the wafer chuck 10 (the flange wall 10f), and a restriction wall 40 (see FIG. 1) that rises upward from the end of the support surface 39 which is away from the axial center position o of the wafer chuck 10. The support surface 39 is a flat surface facing upward and is formed substantially horizontally. When the upper portion of the wafer chuck 10 is located within the chuck housing portion 15c, the restriction wall 40 has a surface facing the outer circumferential edge of the wafer chuck 10 as a centering surface 40c (see FIG. 1). When the drop restriction claw 38 is in the advanced position, the centering surface 40c comes into contact with the outer circumferential edge of the wafer chuck 10, thereby centering the wafer chuck 10 with respect to the card mounting portion 21 of the ceiling wall 15.

The centering surface 40c of the drop restriction claw 38 is constituted by an inclined surface which is inclined downward toward the axial center of the wafer chuck 10. The inclination of the centering surface 40c may be a flat surface or a conical tapered surface.

As shown in FIG. 4, the three-position control device 37 includes a cylinder device 41, the fluid control unit 42, and a displacement restriction device 43. The cylinder device 41 has a piston 44 which is interlocked with the advance and retraction movement of the drop restriction claw 38 which is a control object, and the piston 44 is configured to be capable of being displaced to each position of retracted position, an intermediate position, and advanced position by receiving the thrust of air which is a working fluid. Meanwhile, three positions, that is, a retracted position, an intermediate position, and an advanced position, of the piston 44 correspond to the retracted position, the intermediate position, and the advanced position which are the advanced/retracted positions of the drop restriction claw 38 described above. The fluid control unit 42 controls the supply and discharge of air to and from the cylinder device 41. The displacement restriction device 43 mechanically restricts the displacement of the piston 44 from the retracted position toward the advanced position to an intermediate position.

The cylinder device 41 includes a cylinder body 45 in which the piston 44 is retractably housed, and a piston rod 46 which is connected to the piston 44 and protrudes to the outside by penetrating through an end wall on one end of the cylinder body 45 in the axial direction. The cylinder body 45 is fixedly installed on the outer lower surface 15b of the ceiling wall 15 in parallel to the drop restriction claw 38. The cylinder body 45 is fixed to the outer lower surface 15b of the ceiling wall 15 so that the advance and retraction direction of the piston 44 is parallel to the advance and retraction direction of the drop restriction claw 38. For the cylinder device 41, the side from which the piston rod 46 protrudes relative to the cylinder body 45 is referred to as "front," and the opposite side is referred to as "rear." The front and rear of the cylinder device 41 and the front and rear of the drop restriction claw 38 described above coincide with each other.

The cylinder body 45 is formed in the shape of a sealed cylindrical container. The inside of the cylinder body 45 is separated by the piston 44 into a first air chamber 47 (first fluid chamber) and a second air chamber 48 (second fluid chamber). The first air chamber 47 is a chamber located in front of the piston 44, and when air which is a working fluid is introduced thereinto, the pressure of the introduced air presses the piston 44 in the retraction direction. The second air chamber 48 is a chamber located at the rear side of the piston 44, and when air which is a working fluid is introduced thereinto, the pressure of the introduced air presses the piston 44 in the advance direction.

As shown in FIG. 5, the cylinder body 45 is formed with a first port 49 communicating with the first air chamber 47, and a second port 50 communicating with the second air chamber 48. The first port 49 is connected to a first inlet/outlet passage 51 (inlet/outlet piping) of a fluid control circuit constituting the fluid control unit 42. The second port 50 is connected to a second inlet/outlet passage 52 (inlet/outlet piping) of the fluid control circuit. When the piston 44 is retracted, air at a predetermined pressure is introduced into the first air chamber 47 through the first inlet/outlet passage 51, and air in the second air chamber 48 is discharged to the outside through the second inlet/outlet passage 52. In addition, when the piston 44 is advanced, air at a first working pressure to be described later or a second working pressure higher than that is introduced into the second air chamber 48 through the second inlet/outlet passage 52, and air in the first air chamber 47 is discharged to the outside through the first inlet/outlet passage 51. Meanwhile, the pressure of the air introduced into the second air chamber 48 during the advance operation of the piston 44 (the first working pressure and the second working pressure) is switched in accordance with the operation position of the piston 44. The specific configuration of the fluid control circuit (the fluid control unit 42) will be described in detail later.

As shown in FIG. 4, the displacement restriction device 43 includes a base block 53 which is fixed to the outer lower surface 15b of the ceiling wall 15, an operating rod 54 which is retractably supported by the base block 53, and a spring member 55 that biases the operating rod 54 toward one end in the axial direction. The base block 53 slidably supports the operating rod 54 through a thrust bearing (not shown). The operating rod 54 passes through the base block 53 in the front-rear direction. The base block 53 is fixed to the outer lower surface 15b of the ceiling wall 15 so that the axis L1 of the operating rod 54 is parallel to the axis L2 of the piston rod 46 of the cylinder device 41.

The drop restriction claw 38, the cylinder device 41, and the displacement restriction device 43 are disposed in parallel to each other. Here, when the direction orthogonal to the vertical direction and the advance and retraction direction of the drop restriction claw 38 is referred to as the "width direction" in the three-position control device 37, the drop restriction claw 38, the cylinder device 41, and the displacement restriction device 43 are disposed in this order in the width direction. That is, the drop restriction claw 38 is disposed on one side of the cylinder device 41 in the width direction, and the displacement restriction device 43 is disposed on the other side of the cylinder device 41 in the width direction.

Hereinafter, for the displacement restriction device 43, the same side as the front side of the drop restriction claw 38 or the piston 44 is referred to as "front," and the same side as the rear side of the drop restriction claw 38 or the piston 44 is referred to as "rear."

The operating rod 54 of the displacement restriction device 43 is provided with a fall-off restriction flange 56 at its front end and is provided with a load receiving flange 57 at its rear end. The fall-off restriction flange 56 is disposed on the front side of the base block 53, and the load receiving flange 57 is disposed on the rear side of the base block 53. The outside diameters of the fall-off restriction flange 56 and the load receiving flange 57 are larger than the outside diameter of the middle portion of the operating rod 54. The fall-off restriction flange 56 comes into contact with the front end face of the base block 53, thereby preventing the operating rod 54 from falling out rearward. The spring member 55 (coil spring) which is a biasing means is disposed on the outer circumferential side of the rear region of the operating rod 54. The spring member 55 has a front end in contact with a spring receiving portion 53a recessed on the rear end face of the base block 53, and the other end in contact with the front side of the load receiving flange 57. Meanwhile, in the case of the present embodiment, the spring member 55 to be used is a compression spring.

The load receiving flange 57 is biased rearward by the spring member 55. The spring member 55 is disposed between the spring receiving portion 53a and the load receiving flange 57 in a state where it is compressed in advance by a predetermined amount. Thereby, in a state where the fall-off restriction flange 56 on the front end side of the operating rod 54 comes into contact with the front end face of the base block 53, a preload is applied to the spring member 55 from the spring receiving portion 53a and the load receiving flange 57. This preload becomes an initial load at which the spring member 55 starts to undergo compressive deformation (spring deformation) when an external force directed forward is applied to a rear end face 57r of the load receiving flange 57. Therefore, a predetermined initial load is applied to the spring member 55 set in the displacement restriction device 43. This initial load will be described in detail later.

The rear end face 57r of the load receiving flange 57 serves as a load receiving portion that receives the load of the piston 44 moving toward the advanced position when the piston 44 of the cylinder device 41 is displaced from the retracted position to the intermediate position.

Meanwhile, the load receiving flange 57 may be biased by an air cylinder instead of the spring member 55.

A load transfer arm 58 capable of transferring the load acting on the piston rod 46 from the piston 44 to the rear end face 57r of the load receiving flange 57 is connected to the front end of the piston rod 46 of the cylinder device 41. When the piston 44 is displaced from retracted position to the intermediate position, the rear end face 57r of the load receiving flange 57 which is a load receiving portion is disposed at a position (see FIG. 7) where a front surface 59a of a pressure claw 59 of the load transfer arm 58, which will be described later, comes into contact with the rear side.

The load transfer arm 58 is connected to the front end of the piston rod 46 that protrudes forward from the cylinder body 45. The load transfer arm 58 consists of a base rod 60 that extends out linearly below the outer lower surface 15b in a direction orthogonal to the extension direction of the piston rod 46, and an L-shaped rod 61 which is connected to the end of the base rod 60 and has an approximately L-shaped shape in a front view. The end of the base rod 60 opposite to the connection portion with the L-shaped rod 61 is connected to the lateral side of the drop restriction claw 38. Therefore, the piston 44 of the cylinder device 41 and the drop restriction claw 38 are interlockably connected to each other through the piston rod 46 and the base rod 60.

Although the cylinder device 41 has been described as an example of a cylinder having the piston rod 46, a rodless cylinder may be used. In that case, a member which is interlocked with the piston of the rodless cylinder and the load transfer arm 58 need only be connected to each other.

The L-shaped rod 61 has a rear offset portion 62 that extends out rearward from the connection portion with the base rod 60, and the pressure claw 59 that bends and extends from the rear end of the rear offset portion 62 in a direction away from the drop restriction claw 38. The L-shaped rod 61 is disposed at a position where it does not overlap with the cylinder body 45 of the cylinder device 41 in the front-rear direction. The extension length of the rear offset portion 62 of the L-shaped rod 61 is set so that when the piston 44 of the cylinder device 41 is displaced further rearward than the advanced position, the pressure claw 59 can be displaced further rearward than the front end face of the cylinder body 45. The front surface 59a of the pressure claw 59 is disposed so as to be able to come into contact from the rear side with the rear end face 57r of the load receiving flange 57 which is the load receiving surface of the displacement restriction device 43. When the piston 44 of the cylinder device 41 is displaced from the retracted position to the intermediate position (see FIG. 7), the pressure claw 59 comes into contact with the rear end face 57r of the load receiving flange 57. In this case, the rear end face 57r which is a load receiving portion is configured to receive the load of the piston 44 moving toward the advanced position. In the present embodiment, since the rear offset portion 62 is provided on a portion of the load transfer arm 58, it is possible to shorten the length in the front-rear direction from the front end of the displacement restriction device 43 to the rear end of the cylinder device 41. Therefore, each of the drop restriction mechanisms 24 can be installed compactly in the limited installation space around the chuck housing portion 15c.

Meanwhile, in FIG. 4, reference numeral 17 is a position detection sensor for detecting that the drop restriction claw 38 is located at an intermediate position. As this position detection sensor 17, for example, a laser-type position detection sensor or the like having a light emitting unit and a light receiving unit can be used. Position information detected by the position detection sensor 17 is output to a control device (not shown) that controls each unit of the device. In addition, the cylinder device 41 is provided with a position sensor (not shown) for detecting that the piston 44 in the cylinder body 45 reaches an advanced position, and a position sensor (not shown) for detecting that the piston 44 reaches a retracted position. Whether the drop restriction claw 38 is in the advanced position or the retracted position is detected on the basis of information from these two position sensors. This detection information is output to a control device (not shown).

Figure 8:
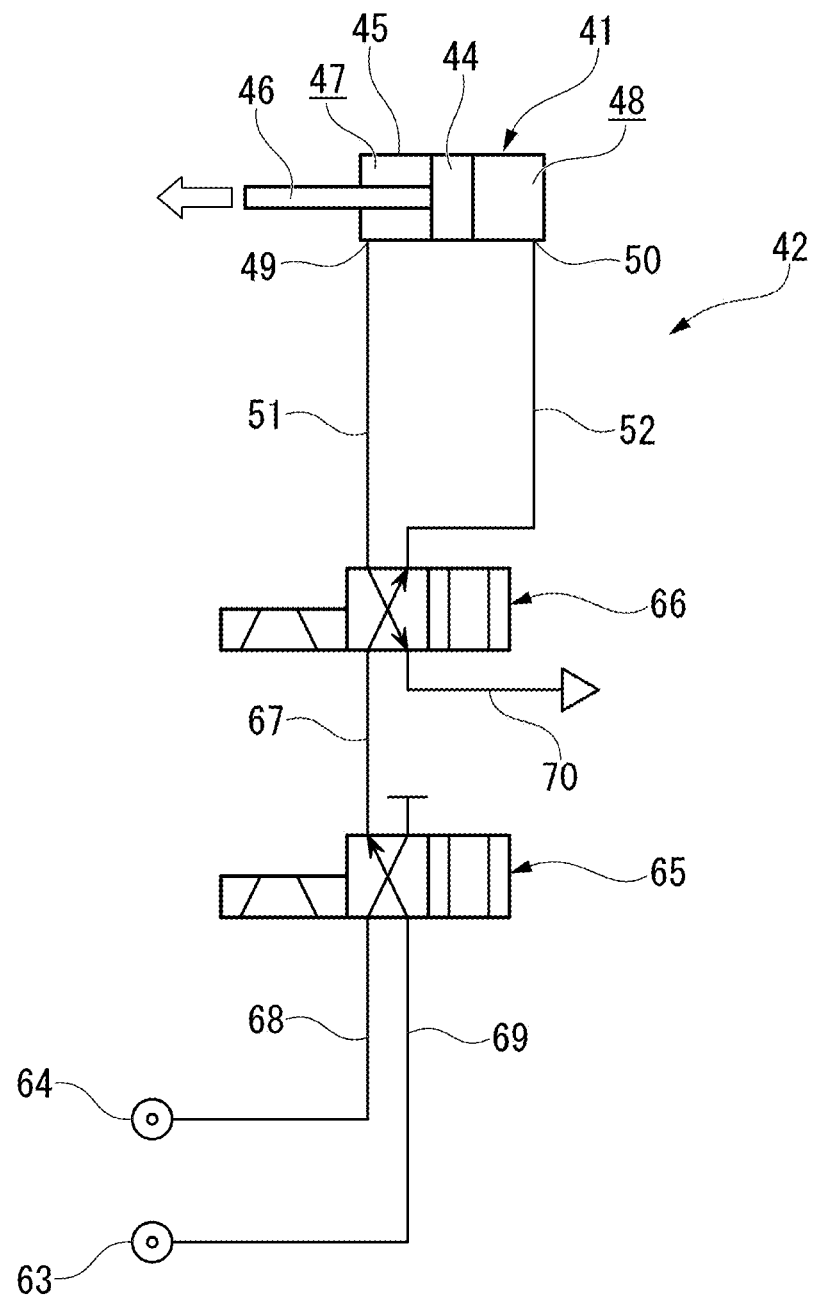
FIG. 8 is a circuit diagram of the fluid control unit illustrating a state when control is performed to bring the drop restriction claw to the intermediate position.
Figure 12:
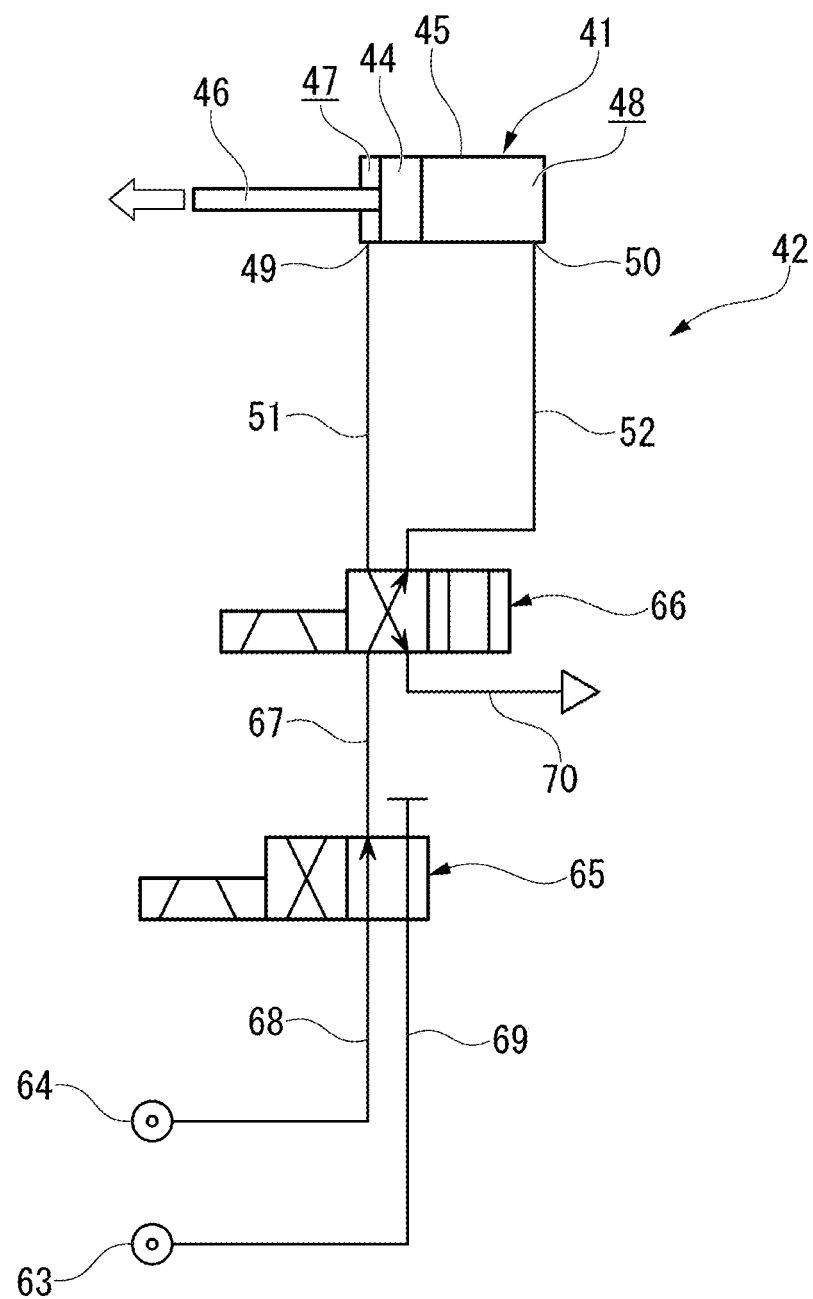
FIG. 12 is a circuit diagram of the fluid control unit illustrating a state when control is performed to bring the drop restriction claw to the advanced position.

FIGS. 5, 8, and 12 are circuit diagrams of the fluid control unit 42. FIG. 5 shows a circuit state when control is performed to bring the drop restriction claw 38 to the retracted position, and FIG. 8 shows a circuit state when control is performed to bring the drop restriction claw 38 from the retracted position to the intermediate position. In addition, FIG. 12 shows a circuit state when control is performed to bring the drop restriction claw 38 from the intermediate position to the advanced position.

As shown in these drawings, the fluid control unit 42 includes a first pressure source 63 and a second pressure source 64 having different air pressures (working pressures), a pressure switching valve 65 capable of selectively switching the air supply using these pressure sources 63 and 64, and a flow path switching valve 66 capable of selectively connecting and switching the supply flow path and the discharge flow path of air (working fluid) to the first air chamber 47 and the second air chamber 48 of the cylinder device 41.

The first pressure source 63 is configured to be capable of supplying a predetermined air pressure (hereinafter referred to as a "first working pressure") such as, for example, 0.1 MPa. On the other hand, the second pressure source 64 is configured to be capable of supplying an air pressure (hereinafter referred to as a "second working pressure") higher than the first working pressure such as, for example, 0.6 MPa.

The pressure switching valve 65 is disposed further upstream (closer to the pressure source) than the flow path switching valve 66 in the flow path. The pressure switching valve 65 and the flow path switching valve 66 are connected to each other through a relay passage 67. The pressure switching valve 65 is configured to be switchable between a first position (see FIGS. 5 and 12) at which an introduction passage 68 communicating with the second pressure source 64 of high pressure is connected to the relay passage 67, and a second position (see FIG. 8) at which an introduction passage 69 communicating with the first pressure source 63 of low pressure is connected to the relay passage 67. The pressure switching valve 65 is constituted by, for example, a solenoid valve that can be switched between the two positions. The solenoid of the pressure switching valve 65 is controlled by a control device (not shown).

In addition to the relay passage 67, the flow path switching valve 66 is connected to the first inlet/outlet passage 51 communicating with the first air chamber 47 of the cylinder device 41, the second inlet/outlet passage 52 communicating with the second air chamber 48 of the cylinder device 41, and a discharge passage 70 for discharging air to the outside. The flow path switching valve 66 is configured to be switchable between the first position (see FIG. 5) at which the relay passage 67 is connected to the first inlet/outlet passage 51 (the first air chamber 47) and the second inlet/outlet passage 52 (the second air chamber 48) is connected to the discharge passage 70, and the second position (see FIGS. 8 and 12) at which the relay passage 67 is connected to the second inlet/outlet passage 52 (the second air chamber 48) and the first inlet/outlet passage 51 (the first air chamber 47) is connected to the discharge passage 70. The flow path switching valve 66 is constituted by, for example, a solenoid valve that can be switched between the two positions. The solenoid of the flow path switching valve 66 is controlled by a control device (not shown).

The fluid control unit 42 is configured to be capable of selectively switching the flow path through which air (working fluid) flows to any of the following first flow path, second flow path, or third flow path through combined control of the pressure switching valve 65 and the flow path switching valve 66.

<First Flow Path>

A flow path for introducing air of the second working pressure which is high pressure into the first air chamber 47 and discharging air from the second air chamber 48. This first flow path is obtained by a combination of the operating states of the pressure switching valve 65 and the flow path switching valve 66 shown in FIG. 5.

<Second Flow Path>

A flow path for introducing air of the first working pressure which is low pressure into the second air chamber 48 and discharging air from the first air chamber 47. This second flow path is obtained by a combination of the operating states of the pressure switching valve 65 and the flow path switching valve 66 shown in FIG. 8.

<Third Flow Path>

A flow path for introducing air of the second working pressure which is high pressure into the second air chamber 48 and discharging air from the first air chamber 47. This third flow path is obtained by a combination of the operating states of the pressure switching valve 65 and the flow path switching valve 66 shown in FIG. 12.

Meanwhile, in the present embodiment, the pressure of air introduced into the first air chamber 47 in first flow path is set to be the same as the pressure of air introduced into the second air chamber 48 in the third flow path (the second working pressure). However, for example, when a pressure source with a different working pressure is further added and the switching position of the pressure switching valve 65 is set to three positions, the pressure of the air introduced into the first air chamber 47 in the first flow path can also be set to a pressure different from the second working pressure.

Here, the initial load of the spring member 55 of the displacement restriction device 43 described above is set to be greater than the thrust of the piston 44 when air of the first working pressure (low pressure) is introduced into the second air chamber 48 of the cylinder device 41, and to be smaller than the thrust of the piston 44 when air of the second working pressure (high pressure) is introduced into the second air chamber 48. Meanwhile, the operating load of the spring member 55 (the load until it moves to the advanced position) is set to be smaller than the thrust of the piston 44 when air of the second working pressure (high pressure) is introduced into the second air chamber 48. That is, the biasing force of the spring member 55 which is a biasing means is set to be smaller than the thrust of the piston 44 when air of the second working pressure (high pressure) is introduced into the second air chamber 48.

The operating rod 54 of the displacement restriction device 43 which is biased in the retraction direction by the spring member 55 is maintained in a stopped state at the intermediate position until the thrust of the piston 44 in the advance direction which is input through the load transfer arm 58 exceeds the initial load of the spring member 55. In this case, the piston 44 and the drop restriction claw 38 are maintained at the intermediate position together with the operating rod 54. On the other hand, when the thrust of the piston 44 in the advance direction which is input through the load transfer arm 58 becomes greater than the initial load of the spring member 55, the operating rod 54 is displaced from the intermediate position toward the advanced position. In this case, the piston 44 and the drop restriction claw 38 are displaced from the intermediate position toward the advanced position together with the operating rod 54.

Meanwhile, in a case where the load receiving flange 57 is biased by an air cylinder instead of the spring member 55, the thrust of the air cylinder in the initial position need only be set to be greater than the thrust of the piston 44 when air of the first working pressure (low pressure) is introduced into the second air chamber 48 of the cylinder device 41, and to be smaller than the thrust of the piston 44 when air of the second working pressure (high pressure) is introduced into the second air chamber 48.

Next, an inspection operation using the prober 11 of the present embodiment will be described.

Figure 6:
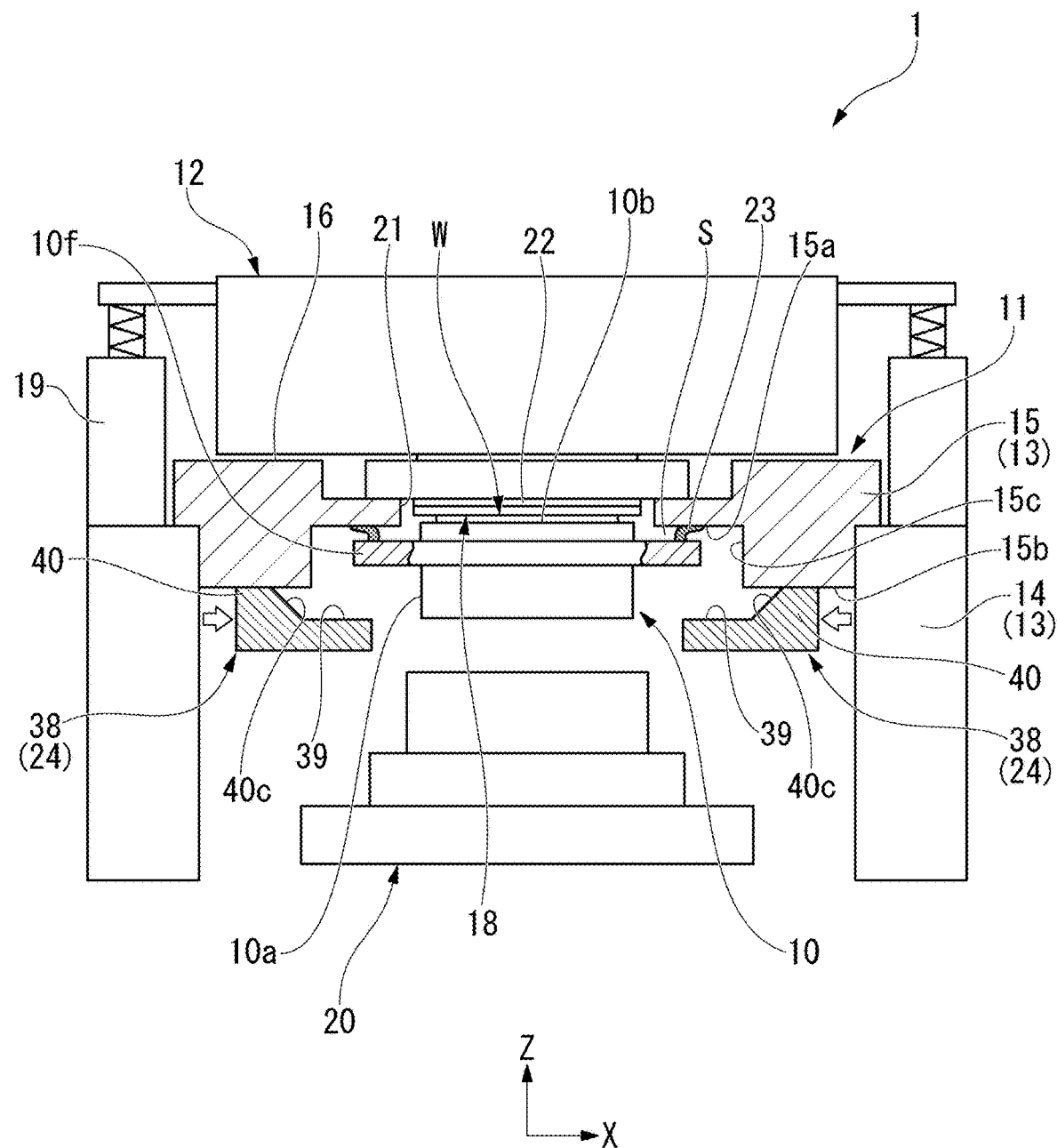
FIG. 6 is a partial cross-sectional front view illustrating a state in which the wafer chuck of the wafer inspection device according to the embodiment is attached.
Figure 7:
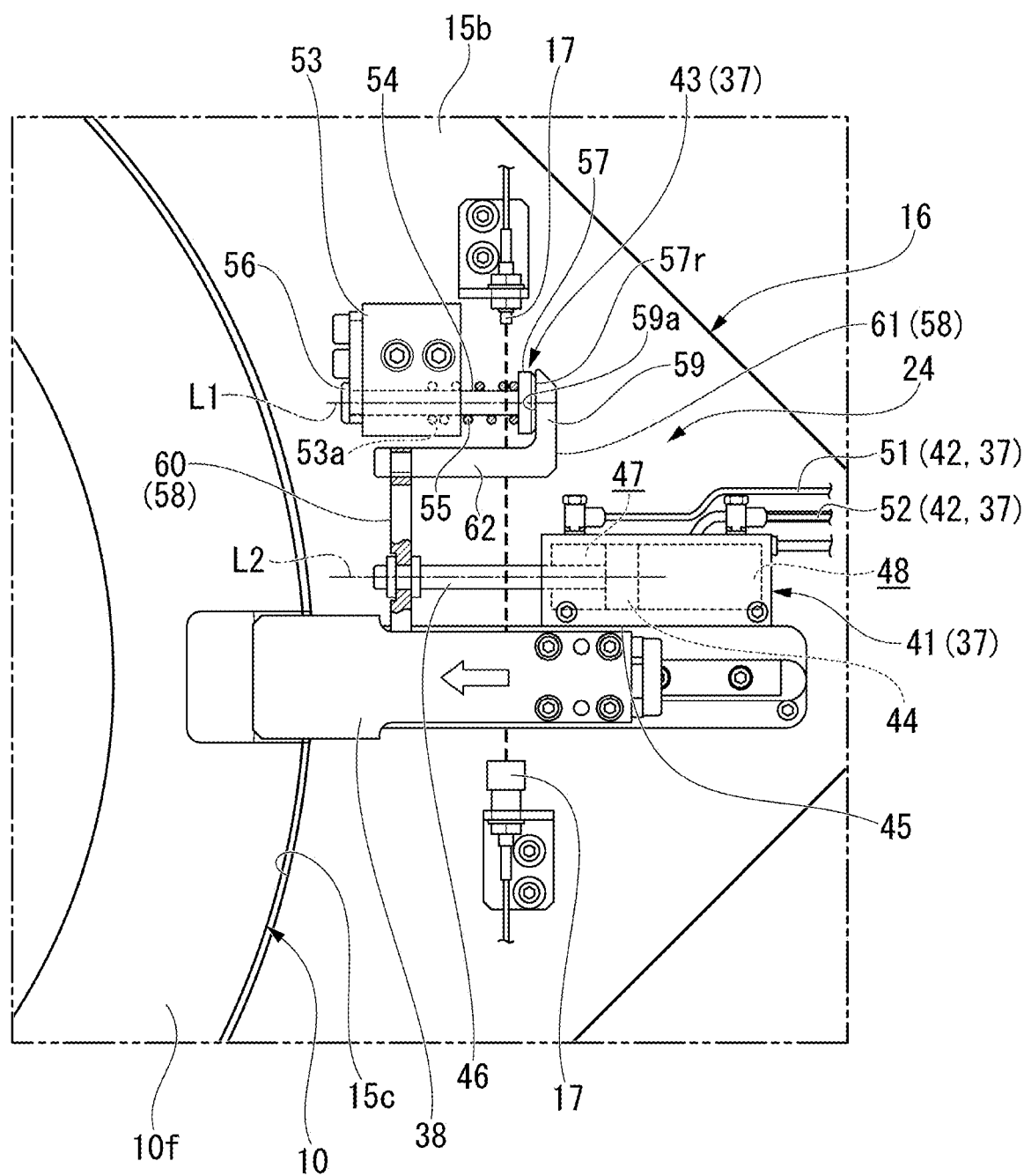
FIG. 7 is an enlarged view of a portion of FIG. 3 when the drop restriction claw is in an intermediate position.
Figure 9:
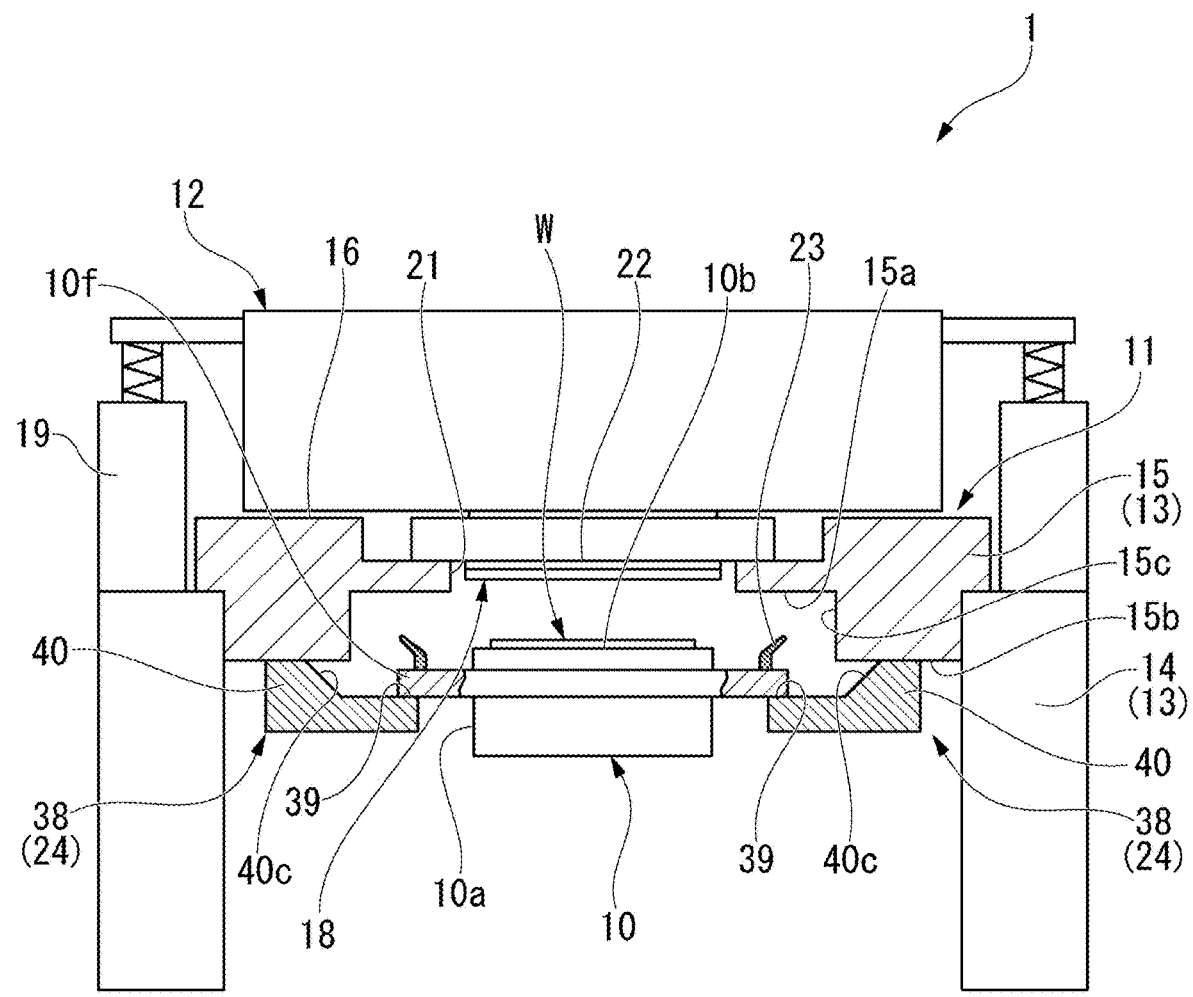
FIG. 9 is a partial cross-sectional front view illustrating a state in which the dropping of the wafer chuck of the wafer inspection device according to the embodiment is restricted.
Figure 10:
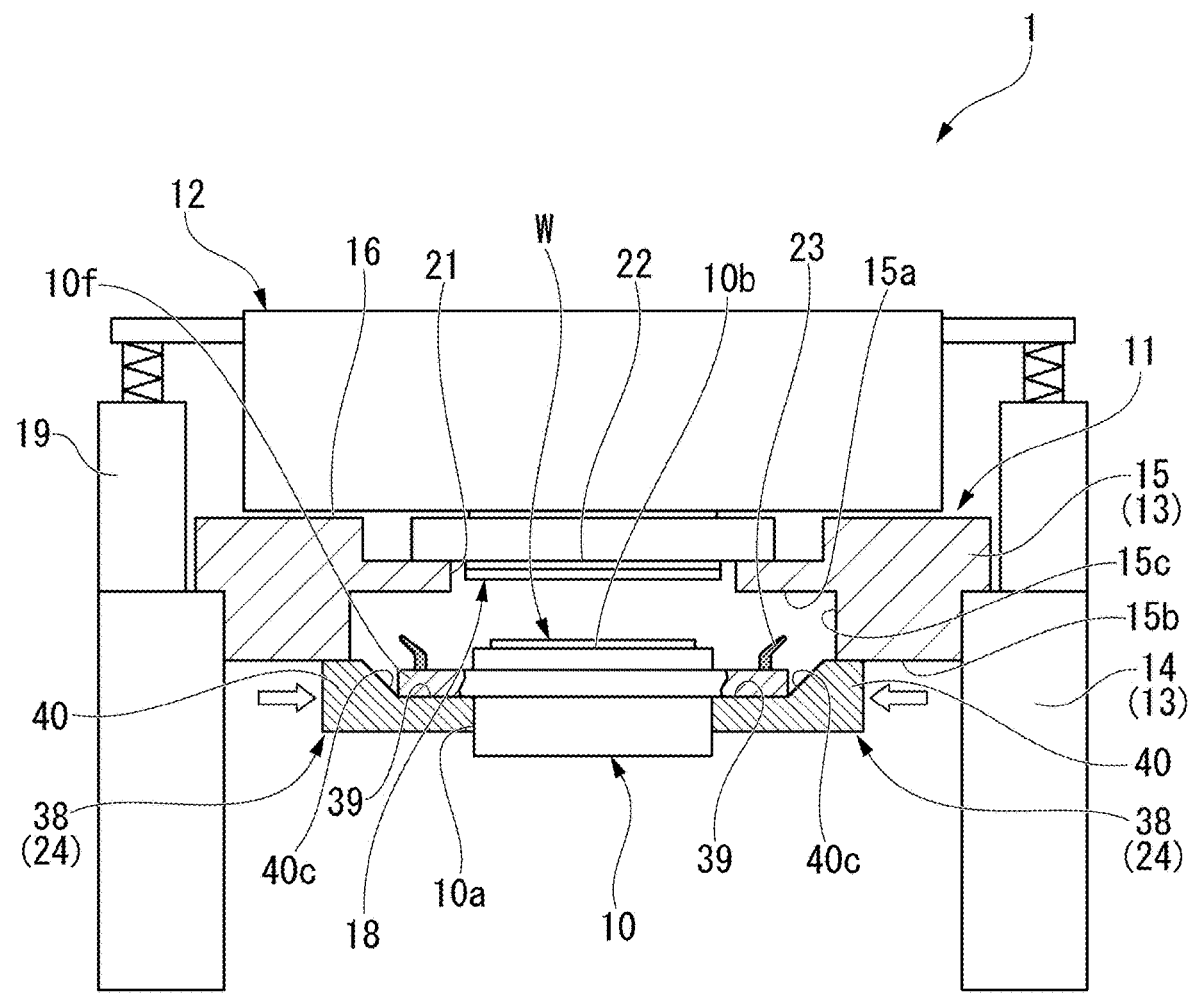
FIG. 10 is a partial cross-sectional front view illustrating a state in which the wafer chuck of the wafer inspection device according to the embodiment is centered.
Figure 11:
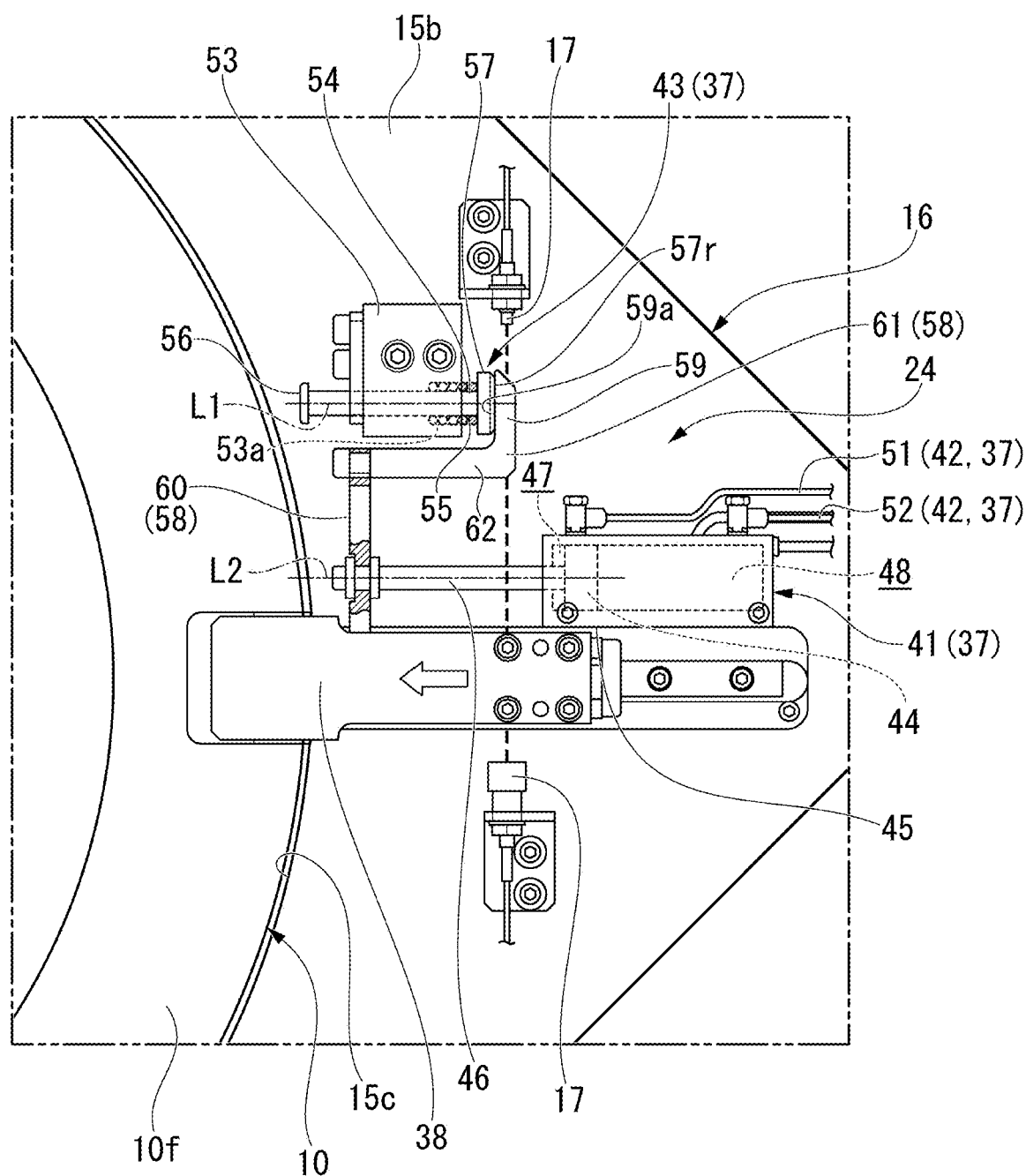
FIG. 11 is an enlarged view of a portion of FIG. 3 when the drop restriction claw is in an advanced position.

FIGS. 6, 9, and 10 are partial cross-sectional front views similar to that in FIG. 1 of the wafer inspection device 1. FIG. 6 shows a state in which the wafer chuck 10 is adsorbably fixed to the lower surface of the ceiling wall 15 of the measurement unit 16, FIG. 9 shows a state in which the drop restriction claw 38 restricts the dropping of the wafer chuck 10, and FIG. 10 shows a state in which the drop restriction claw 38 centers the wafer chuck 10. In addition, FIG. 7 is a drawing corresponding to FIG. 4 when the drop restriction claw 38 is in the intermediate position, and FIG. 11 is a drawing corresponding to FIG. 4 when the drop restriction claw 38 is in the advanced position. In the initial state, as shown in FIG. 1, the wafer chuck 10 is held by a chuck holding portion on the upper portion of the alignment device 20, and the wafer W is placed on the mounting surface 10b of the wafer chuck 10.

The alignment device 20 is moved by a moving device (not shown) to the measurement unit 16 where the inspection is performed. In this state, the chuck holding portion on the upper portion of the alignment device 20 is maintained in a lowered state.

In this state, an alignment operation is performed. Specifically, the X-axis moving table 30 is moved so that the probe position detection cameras 33 shown in FIG. 2 are located below the probe of the probe card 18. Thereafter, the camera moving mechanism 34 moves the probe position detection cameras 33 in the Z-axis direction to adjust the focus, and the probe position detection cameras 33 detect the tip position of the probe on the probe card 18. The position of the probe tip in the horizontal plane (position in the X and Y directions) is detected the coordinates of the camera, and the vertical position (position in the Z direction) is detected on the basis of the focal position of the camera.

Meanwhile, the probe card 18 is typically provided with hundreds to thousands of probes. Therefore, the detection of the tip positions of the above probes using the probe position detection cameras 33 is not performed for all probes, but is usually performed only for specific probes.

Next, the X-axis moving table 30 is moved so that the wafer W held by the wafer chuck 10 is located below the alignment camera 35. In this state, the positions of the electrodes of each chip on the wafer W are detected by the alignment camera 35. In this case, it is not necessary to detect the positions of all the electrodes of one chip, and the positions of some of the electrodes need only be detected. In addition, in this case, it is not necessary to detect the electrodes of all the chips on the wafer W, and the electrodes of some of the chips need only be detected.

Next, based on the array of the probes on the probe card 18 detected as described above and the array of the electrodes on the wafer W, the Z axis moving and rotating unit 32 adjusts the position in the rotational direction so that the array direction of the probes and the array direction of the electrodes on the wafer W coincide with each other. Thereafter, the position of the wafer chuck 10 in the X and Y directions is adjusted by the X-axis actuator 31 and the Y-axis actuator 29 so that the electrodes of a chip to be inspected on the wafer W are located under the corresponding probes of the probe card 18. Thereafter, the wafer chuck 10 is raised in the Z-axis direction by the Z axis moving and rotating unit 32.

Meanwhile, in this case, each of the drop restriction claws 38 of the four drop restriction mechanisms 24 disposed on the lower surface of the ceiling wall 15 of the measurement unit 16 are located at the retracted position as shown in FIGS. 1 and 4.

The Z axis moving and rotating unit 32 stops raising the wafer chuck 10 when the electrodes of the chip on the wafer W reach a height at which they come into contact with the probes of the probe card 18. In this case, the ring-shaped seal member 23 on the upper portion of the wafer chuck 10 comes into contact with the lower surface (the chuck adsorption surface 15a) of the ceiling wall 15 around the probe card 18, as shown in FIG. 6, and a sealed internal space S is formed between the lower surface of the ceiling wall 15 and the wafer chuck 10.

Thereafter, the internal space S undergoes vacuum suction by the operation of a suction device (not shown). This causes the pressure in the internal space to decrease, and the wafer chuck 10 is pulled toward the lower surface of the probe card 18. As a result, each probe of the probe card 18 comes into contact with the corresponding electrode on the wafer W with a uniform force.

When the wafer chuck 10 holding the wafer W is thus adsorbably fixed to the ceiling wall 15 of the measurement unit 16, the alignment device 20 lowers the chuck holding portion in the Z-axis direction by the operation of the Z axis moving and rotating unit 32. This causes the chuck holding portion of the alignment device 20 to move away from the wafer chuck 10.

Thereafter, under control performed by the fluid control unit 42 of the four drop restriction mechanisms 24, each of the drop restriction claws 38 is advanced to the intermediate position as shown in FIGS. 6 and 7. In this case, each of the fluid control units 42 is switched from the state shown in FIG. 5 (state of the first flow path) to the state shown in FIG. 8 (state of the second flow path). As a result, low-pressure (first fluid pressure) air is introduced into the second air chamber 48 of the cylinder device 41, and the air in the first air chamber 47 is discharged to the outside. In this case, when the piston 44 of the cylinder device 41 is displaced to the intermediate position by receiving the thrust of low-pressure air, the load transfer arm 58 connected to the piston rod 46 comes into contact with the rear end face 57r (load receiving portion) of the load receiving flange 57 of the displacement restriction device 43 as shown in FIG. 7. This causes the piston 44 and the drop restriction claw 38 to stop at the intermediate position.

In this case, the initial load of the spring member 55 is acting on the load receiving flange 57, and the initial load is set to be greater than the thrust of the piston 44 when air of the first working pressure (low pressure) is introduced into the second air chamber 48. For this reason, even when the load transfer arm 58 receives the thrust of the piston 44 and comes into contact with the rear end face 57r of the load receiving flange 57, the operating rod 54 will not be displaced forward. Therefore, the drop restriction claw 38 is maintained at the specified intermediate position.

In this state, the tips of all the four drop restriction claws 38 protrude inside the chuck housing portion 15c by a predetermined amount, and the flat support surface 39 of each of the drop restriction claws 38 is located below the flange wall 10f of the wafer chuck 10. As a result, even when the wafer chuck 10 moves away from the lower surface of the ceiling wall 15 due to the power supply being turned off, the wafer chuck 10 can be received by the support surface 39 of the drop restriction claw 38.

When preparation for testing in the measurement unit 16 is thus completed, a power supply current and a test signal are supplied from the test head 12 to each chip of the wafer W. The test head 12 receives a detection signal which is output from each chip of the wafer W, and determines whether each chip operates normally on the basis of the detection signal.

The wafer W for which the inspection has been completed waits with the wafer chuck 10 still adsorbed to the ceiling wall 15 until the alignment device 20 returns from the other the measurement unit 16.

When the alignment device 20 returns to the lower position of the wafer chuck 10, the alignment device 20 raises the chuck holding portion using the Z axis moving and rotating unit 32 and engages the chuck holding portion with the wafer chuck 10.

Thereafter, each of the drop restriction claws 38 of the four drop restriction mechanisms 24 is displaced to the retracted position as shown in FIG. 4 under control of the fluid control unit 42. In this case, the fluid control unit 42 switches the flow path as shown in FIG. 5, and air of the second working pressure (high pressure) is introduced into the first air chamber 47 of the cylinder device 41, while the air in the second air chamber 48 is discharged to the outside.

Next, the decompression of the internal space S between the wafer chuck 10 and the ceiling wall 15, which is sealed by the ring-shaped seal member 23, is released, and the wafer chuck 10 is moved away from the lower surface of the ceiling wall 15. Thereby, the wafer chuck 10 is transferred to the chuck holding portion of the alignment device 20.

Thereafter, the alignment device 20 operates the Z axis moving and rotating unit 32 to lower the inspected wafer W together with the wafer chuck 10. The alignment device 20 then moves to a predetermined transfer position and unloads the inspected wafer W.

On the other hand, when the wafer chuck 10 is adsorbed to the lower surface of the ceiling wall 15 by vacuum adsorption, there may be a situation in which the wafer chuck 10 moves away from the lower surface of the ceiling wall 15 due to the power supply of the suction device being turned off, or the like. In this case, since the drop restriction claw 38 of each of the drop restriction mechanisms 24 is maintained at the intermediate position, the wafer chuck 10 is received by the plurality of drop restriction claws 38 as shown in FIG. 9. However, when the decompression of the internal space S is released and the wafer chuck 10 moves away from the lower surface of the ceiling wall 15, the wafer chuck 10 does not necessarily descend to a fixed position in a stable posture, and there may also be a situation in which a portion of the outer circumferential edge will descend to a position away from the support surface 39 of the drop restriction claw 38.

In this case, a portion of the outer circumferential edge of the wafer chuck 10 comes into contact with the inclined centering surface 40c of the drop restriction claw 38 and is guided along the inclination of the centering surface 40c in the direction of the support surface 39. As a result, the wafer chuck 10 is reliably supported in a stable posture on the support surface 39 of the four drop restriction claws 38.

In a case where the wafer chuck 10 is transferred to the alignment device 20 together with the wafer W from the state in which the wafer chuck 10 is supported on the support surfaces 39 of the four drop restriction claws 38 as described above, first, each of the drop restriction claws 38 of the four drop restriction mechanisms 24 is displaced to the advanced position as shown in FIGS. 10 and 11 to center the wafer chuck 10 relative to the chuck housing portion 15c. In this case, the fluid control unit 42 is switched to the flow path state (state of the third flow path) shown in FIG. 12, where air of the second working pressure (high pressure) is introduced into the second air chamber 48 of the cylinder device 41, and air of the first air chamber 47 is discharged to the outside. In this case, the load transfer arm 58 connected to the piston rod 46 is already in contact with the rear end face 57r of the load receiving flange 57 of the displacement restriction device 43, but the thrust of the piston 44 acting on the load receiving flange 57 through the load transfer arm 58 increases.

Here, the initial load of the spring member 55 acting on the operating rod 54 of the displacement restriction device 43 is set to be smaller than the thrust of the piston 44 when air of the second working pressure (high pressure) is introduced into the second air chamber 48. Therefore, when air of the second working pressure is introduced into the second air chamber 48 at this time and a thrust in the advance direction acts on the piston 44, the load transfer arm 58 overcomes the load of the spring member 55 of the displacement restriction device 43 and is displaced to the advanced position. As a result, each of the drop restriction claws 38 is displaced to the advanced position as shown in FIGS. 10 and 11.

In this way, when each of the drop restriction claws 38 is displaced to the advanced position, the support surface 39 of each of the drop restriction claws 38 slides against the lower surface of the flange wall 10f of the wafer chuck 10, while the centering surface 40c presses the outer circumferential edge of the flange wall 10f of the wafer chuck 10 in the central direction of the chuck housing portion 15c. As a result, the wafer chuck 10 is centered so as to coincide with a specified centering position, and the relative position of the lower alignment device 20 with respect to the chuck holding portion is also corrected.

Thereafter, each of the drop restriction claws 38 of the four drop restriction mechanisms 24 is retracted to the intermediate position as shown in FIGS. 7 and 9, and in this state, the chuck holding portion of the alignment device 20 is raised to engage the chuck holding portion with the wafer chuck 10. Thereafter, the drop restriction claws 38 of the four drop restriction mechanisms 24 are displaced to the retracted position, and the chuck holding portion of the alignment device 20 is lowered. The alignment device 20 then moves to a predetermined transfer position, and unloads the inspected wafer W.

As described above, the three-position control device 37 of the present embodiment includes the cylinder device 41, the fluid control unit 42, and the displacement restriction device 43. The cylinder device 41 is provided with the first air chamber 47 (first fluid chamber) into which air is introduced so that the piston 44 is pressed toward the retracted position, and the second air chamber 48 (second fluid chamber) into which air is introduced so that the piston 44 is pressed toward the advanced position. The fluid control unit 42 is configured to be switchable between a first flow path for introducing air of a predetermined pressure into the first air chamber 47 and discharging air from the second air chamber 48, a second flow path for introducing air of a first working pressure (low pressure) into the second air chamber 48 and discharging air from the first air chamber 47, and a third flow path for introducing air of a second working pressure (high pressure) into the second air chamber 48 and discharging air from the first air chamber 47. The displacement restriction device 43 includes a load receiving portion (the rear end face 57r of the load receiving flange 57) that receives the load of the piston 44 in the advance direction when the piston 44 is displaced from the retracted position to the intermediate position, and the spring member 55 that biases the load receiving portion in a direction against the load input of the piston 44. The spring member 55 is set so that the biasing force is greater than the thrust of the piston 44 in the advance direction caused by the first working pressure and smaller than the thrust of the piston 44 in the advance direction caused by the second working pressure.

Therefore, by appropriately switching the flow paths of air supplied to and discharged from the first air chamber 47 and the second air chamber 48 of the cylinder device 41 by the fluid control unit 42, the piston 44 which is interlocked with a control object can be accurately stopped at three positions, that is, the retracted position, the intermediate position, and the advanced position. In particular, when the piston 44 is displaced from the retracted position to the intermediate position, air of the first working pressure is introduced into the second air chamber 48 and the piston 44 is displaced to the intermediate position, so that the load transfer arm 58 which is interlocked with the piston 44 comes into contact with the load receiving portion (the rear end face 57r of the load receiving flange 57) of the displacement restriction device 43 and stops accurately at the intermediate position. That is, the position of the piston 44 can be accurately maintained at the intermediate position by the balance between the initial load of the spring member 55 of the displacement restriction device 43 and the thrust of the air acting on the piston 44.

Therefore, in a case where the three-position control device 37 of the present embodiment is adopted, it is possible to quickly and accurately displace a control object to an intermediate position, and to stably maintain the displaced control object in a stopped state at the intermediate position.

In addition, in the three-position control device 37 of the present embodiment, the working pressure of air when the piston 44 is displaced from the intermediate position to the retracted position is set to be equal to the working pressure (second working pressure) of air when the piston 44 is displaced from the intermediate position to the advanced position. For this reason, the pressure sources that can be switched and used by the fluid control unit 42 can be restricted to only two types with different pressures (the first pressure source 63 of low pressure and the pressure source 64 of high pressure). Therefore, in a case where this configuration is adopted, it is possible to simplify a supply and discharge system of air to be used, and to make the fluid control unit 42 compact.

Meanwhile, the working pressure of air when the piston 44 is displaced from the intermediate position to the retracted position may be set to be equal to the working pressure (first working pressure) of air when the piston 44 is displaced from the retracted position to the intermediate position. In this case, the same effect can be obtained.

Further, in the three-position control device 37 of the present embodiment, the fluid control unit 42 is provided with the flow path switching valve 66 capable of selectively connecting and switching the supply flow path and the discharge flow path to the first air chamber 47 and the second air chamber 48, and the pressure switching valve 65 capable of selectively switching the pressure source connected to the air supply flow path between the first pressure source 63 and the second pressure source 64. Therefore, in a case where this configuration is adopted, a combination of the flow path switching valve 66 and the pressure switching valve 65 makes it possible to easily obtain the fluid control unit 42 capable of switching between the first, second, and third flow paths.

In addition, in the three-position control device 37 of the present embodiment, the displacement restriction device 43 is installed outside the cylinder body 45 so that the direction of displacement of the load receiving portion (the rear end face 57r of the load receiving flange 57) (the axial direction of the operating rod 54) is parallel to the axial direction of the piston rod 46. The load transfer arm 58 capable of transferring a load acting on the piston rod 46 from the piston 44 to the load receiving portion (the rear end face 57r of the load receiving flange 57) is connected to the piston rod 46. Therefore, even in a case where the displacement restriction device 43 is disposed at a separated position outside the cylinder body 45 (a position separated in the width direction), the behavior of the piston 44 can be transferred to the load receiving portion of the displacement restriction device 43 through the load transfer arm 58.

Therefore, in a case where this configuration is adopted, it becomes possible to flexibly change the space occupation form of the three-position control device 37 in accordance with the installation position and the like. Specifically, for example, as shown in FIG. 3, the drop restriction claw 38 (control object), the cylinder device 41, and the displacement restriction device 43 can be disposed substantially side-by-side, making it possible to compactly dispose these components at the four corners of the ceiling wall 15.

In addition, in the three-position control method of the present embodiment described above, the initial load of the spring member 55 of the displacement restriction device 43 is set to be greater than a thrust caused by the first working pressure when the piston 44 is displaced from the retracted position to the intermediate position, and to be smaller than a thrust caused by the second working pressure when the piston 44 is moved from the intermediate position to the advanced position. When the piston 44 is actually displaced from the retracted position to the intermediate position and stopped at the intermediate position, air of the first working pressure is introduced into the second air chamber 48 and air is discharged from the first air chamber 47, and when the piston 44 is displaced from the intermediate position to the advanced position, air of the second working pressure higher than the first working pressure is introduced into the second air chamber 48 and air is discharged from the first air chamber 47. As a result, the position of the piston 44 is accurately maintained at the intermediate position due to the balance between the initial load of the spring member 55 of the displacement restriction device 43 and the thrust of air acting on the piston 44. Therefore, in a case where the three-position control method of the present embodiment is adopted, it is possible to quickly and accurately displace the control object to the intermediate position, and to stably maintain the displaced control object in a stopped state at the intermediate position.

In addition, in the three-position control method of the present embodiment, the pressure of the air introduced into the second air chamber 48 is changed when the piston 44 is displaced from retracted position to the intermediate position and when the piston 44 is displaced from the intermediate position to the advanced position. Therefore, the piston 44 can be quickly displaced from the intermediate position to the advanced position without being significantly affected by the difference in pressure receiving surfaces located at the front and rear of the piston 44, and the like.

Meanwhile, the present invention is not limited to the above-described embodiment, and various design modifications are possible without departing from the spirit and scope of the invention. For example, in the above embodiment, the object of position control performed by the three-position control device 37 is the drop restriction claw 38 of the wafer inspection device 1, but the object of position control performed by the three-position control device 37 is not limited to this. The object of position control may be any other part of the wafer inspection device 1. In addition, the three-position control device 37 can also be applied to various devices other than the wafer inspection device 1.

In addition, in the above embodiment, the cylinder device 41 that actuates the piston 44 using air pressure is adopted, but the cylinder device 41 is not limited to this. The cylinder device 41 may be configured to actuate the piston 44 using the pressure of other fluids such as, for example, a special gas or liquid.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

37 Three-position control device
41 Cylinder device
42 Fluid control unit
43 Displacement restriction device
44 Piston
45 Cylinder body
46 Piston rod
47 First air chamber (first fluid chamber)
48 Second air chamber (second fluid chamber)
55 Spring member (biasing means)
57r Rear end face
58 Load transfer arm
63 First pressure source
64 Second pressure source
65 Pressure switching valve
66 Flow path switching valve

What is claimed is:

1. A three-position control device comprising:
   a cylinder device having a piston which is interlocked with a control object, the piston being displaceable to each of a retracted position, an intermediate position, and an advanced position by receiving a thrust of a working fluid;
   a fluid control unit that controls intake and discharge of a working fluid to and from the cylinder device; and
   a displacement restriction device that restricts displacement of the piston moving from the retracted position toward the advanced position at the intermediate position, wherein
   the cylinder device has:
      a first fluid chamber into which the working fluid is introduced so that the piston is pressed toward the retracted position; and
      a second fluid chamber into which the working fluid is introduced so that the piston is pressed toward the advanced position,
   the fluid control unit is switchable between a first flow path for introducing the working fluid into the first fluid chamber at a predetermined working pressure and discharging the working fluid from the second fluid chamber, a second flow path for introducing the working fluid into the second fluid chamber at a first working pressure and discharging the working fluid from the first fluid chamber, and a third flow path for introducing the working fluid into the second fluid chamber at a second working pressure higher than the first working pressure and discharging the working fluid from the first fluid chamber,
   the displacement restriction device has a load receiving portion that receives a load of the piston moving toward the advanced position when the piston is displaced from the retracted position to the intermediate position, and a biasing means for biasing the load receiving portion in a direction against a load input from the piston,
   a biasing force of the biasing means is set to be greater than a thrust of the piston caused by the first working pressure and smaller than the thrust of the piston caused by the second working pressure,
   the biasing means is a spring member, an initial load at which the spring member starts to deform is set to be greater than the thrust of the piston caused by the first working pressure and smaller than the thrust of the piston caused by the second working pressure, the predetermined working pressure is set to be equal to the first working pressure or the second working pressure, and the fluid control unit includes:

a flow path switching valve capable of selectively connecting and switching a supply flow path and a discharge flow path of the working fluid to the first fluid chamber and the second fluid chamber; and a pressure switching valve capable of selectively switching a pressure source connected to the supply flow path between a first pressure source whose pressure is the first working pressure and a second pressure source whose pressure is the second working pressure.

2. The three-position control device according to claim 1, wherein the cylinder device includes a cylinder body in which the piston is retractably housed, and a piston rod which is connected to the piston and protrudes outward from an axial end of the cylinder body, the displacement restriction device is installed outside the cylinder body so that a displacement direction of the load receiving portion is parallel to the axial direction of the piston rod, and a load transfer arm capable of transferring a load acting on the piston rod from the piston to the load receiving portion is connected to the piston rod.

3. A three-position control method using a cylinder device having a piston which is interlocked with a control object, the piston being displaceable to each of a retracted position, an intermediate position, and an advanced position by receiving a thrust of a working fluid, a fluid control unit that controls intake and discharge of a working fluid to and from the cylinder device, and a displacement restriction device that restricts displacement of the piston moving from the retracted position toward the advanced position at the intermediate position, wherein the cylinder device is provided with a first fluid chamber into which the working fluid is introduced so that the piston is pressed toward the retracted position and a second fluid chamber into which the working fluid is introduced so that the piston is pressed toward the advanced position, the displacement restriction device is provided with a load receiving portion that receives a load of the piston moving toward the advanced position when the piston is displaced from the retracted position to the intermediate position, and a biasing means for biasing the load receiving portion in a direction against a load input from the piston, a biasing force of the biasing means is set to be greater than a thrust caused by a working pressure of the working fluid when the piston is displaced from the retracted position to the intermediate position, and to be smaller than a thrust caused by the working pressure of the working fluid when the piston is displaced from the intermediate position to the advanced position, the biasing means is a spring member, an initial load at which the spring member starts to deform is set to be greater than the thrust of the piston caused by the first working pressure and smaller than the thrust of the piston caused by the second working pressure, the fluid control unit includes:

a flow path switching valve capable of selectively connecting and switching a supply flow path and a discharge flow path of the working fluid to the first fluid chamber and the second fluid chamber; and a pressure switching valve capable of selectively switching a pressure source connected to the supply flow path between a first pressure source whose pressure is the first working pressure and a second pressure source whose pressure is the second working pressure, and the method comprises:

when the piston is displaced to the retracted position, introducing the working fluid into the first fluid chamber at a predetermined working pressure and discharging the working fluid from the second fluid chamber;

when the piston is displaced from the retracted position to the intermediate position and stopped at the intermediate position, introducing the working fluid into the second fluid chamber at a first working pressure and discharging the working fluid from the first fluid chamber; and when the piston is displaced from the intermediate position to the advanced position, introducing the working fluid into the second fluid chamber at a second working pressure higher than the first working pressure and discharging the working fluid from the first fluid chamber, wherein the predetermined working pressure is set to be equal to the first working pressure or the second working pressure.

* * * * *